United States Patent
Aoyama et al.

(10) Patent No.: US 11,626,544 B2
(45) Date of Patent: Apr. 11, 2023

(54) DISPLAY DEVICE

(71) Applicant: Semiconductor Energy Laboratory Co., Ltd., Kanagawa-ken (JP)

(72) Inventors: Tomoya Aoyama, Kanagawa (JP); Koji Kusunoki, Kanagawa (JP); Kensuke Yoshizumi, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 71 days.

(21) Appl. No.: 17/260,325

(22) PCT Filed: Jul. 9, 2019

(86) PCT No.: PCT/IB2019/055820
§ 371 (c)(1),
(2) Date: Jan. 14, 2021

(87) PCT Pub. No.: WO2020/016701
PCT Pub. Date: Jan. 23, 2020

(65) Prior Publication Data
US 2021/0296543 A1    Sep. 23, 2021

(30) Foreign Application Priority Data

Jul. 20, 2018   (JP) .............................. JP2018-136888

(51) Int. Cl.
| H01L 33/50 | (2010.01) |
| H01L 27/15 | (2006.01) |
| H01L 33/46 | (2010.01) |

(52) U.S. Cl.
CPC .......... H01L 33/504 (2013.01); H01L 27/156 (2013.01); H01L 33/46 (2013.01)

(58) Field of Classification Search
None
See application file for complete search history.

(56) References Cited

U.S. PATENT DOCUMENTS

| 7,399,991 B2 | 7/2008 | Seo et al. |
| 9,182,631 B2 | 11/2015 | Iwata et al. |

(Continued)

FOREIGN PATENT DOCUMENTS

| CN | 103733243 A | 4/2014 |
| CN | 108205217 A | 6/2018 |

(Continued)

OTHER PUBLICATIONS

Machine made English-language translation of WO-2015174464-A1 (Year: 2015).*

(Continued)

*Primary Examiner* — Robert K Carpenter
(74) *Attorney, Agent, or Firm* — Husch Blackwell LLP

(57) ABSTRACT

A display device having high light-extraction efficiency is provided. A low-power display device is provided. In a red or green pixel included in the display device, a light-emitting element, an optically functional layer, and a wavelength-conversion layer are stacked in this order. The light-emitting element emits blue light, the optically functional layer transmits the blue light and reflects red and green light, and the wavelength-conversion layer converts the blue light into red or green light. The blue light emitted by the light-emitting element passes through the optically functional layer and enters the wavelength-conversion layer, and red or green light is emitted to the outside. The red or green light emitted from the wavelength-conversion layer to the optically functional layer side is reflected by the optically functional layer and emitted to the outside, which improves light-extraction efficiency.

18 Claims, 19 Drawing Sheets

(56) References Cited

U.S. PATENT DOCUMENTS

| | | |
|---|---|---|
| 2014/0168572 A1 | 6/2014 | Iwata et al. |
| 2016/0033823 A1* | 2/2016 | Lee ................... G02F 1/133617 349/71 |
| 2018/0173053 A1 | 6/2018 | Yoon et al. |
| 2018/0190747 A1 | 7/2018 | Son et al. |
| 2018/0219183 A1 | 8/2018 | Song |

FOREIGN PATENT DOCUMENTS

| | | | |
|---|---|---|---|
| CN | 108269823 A | 7/2018 | |
| EP | 3 343 551 A1 | 7/2018 | |
| JP | 2002-324673 A | 11/2002 | |
| JP | 2014-199267 A | 10/2014 | |
| JP | 2016-218151 A | 12/2016 | |
| JP | 2017-181901 A | 10/2017 | |
| KR | 2018-0072033 A | 6/2018 | |
| KR | 2018-0079078 A | 7/2018 | |
| WO | WO 2013/021941 A1 | 2/2013 | |
| WO | WO-2015174464 A1 * | 11/2015 | ............... G02B 5/20 |
| WO | WO 2016/098570 A1 | 6/2016 | |

OTHER PUBLICATIONS

International Search Report (Application No. PCT/IB2019/055820) dated Nov. 5, 2019.

Written Opinion (Application No. PCT/IB2019/055820) dated Nov. 5, 2019.

Zhao, L. et al., "Development of Semi-Interpenetrating Polymer Networks and Quantum Dots-Polymer Nanocomposites for Low-Cost, Flexible OLED Display Application," Journal of Materials Research, Jan. 25, 2012, vol. 27, No. 4, pp. 639-652.

* cited by examiner

DISPLAY DEVICE

This application is a 371 of international application PCT/IB2019/055820 filed on Jul. 9, 2019 which is incorporated herein by reference.

TECHNICAL FIELD

One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor properties.

BACKGROUND ART

In recent years, electronic devices which incorporate display devices have been diversified. For example, large screen devices such as digital signage and television devices, small- and medium-sized screen devices such as smartphones and tablet terminals, and tiny screen devices for virtual reality (VR) and augmented reality (AR) can be given.

The diversity of electronic devices is accompanied with the diversity of incorporated display devices. Examples of the display devices include a liquid crystal display device, a light-emitting device including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying a voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

In addition, quantum dots have been studied to be used for a color conversion (wavelength conversion) material of light-emitting elements. A quantum dot is a semiconductor nanocrystal with a diameter of several nanometers; its size can be changed to adjust an emission wavelength easily. For example, Patent Document 2 discloses a technique in which a curable resin composition including quantum dots is used for the layer to convert a wavelength of light from an organic EL element.

REFERENCE

Patent Document

[Patent Document 1] Japanese Published Patent Application No. 2002-324673

[Patent Document 2] PCT International Publication No. WO2016/098570

SUMMARY OF THE INVENTION

Problems to be Solved by the Invention

Light emitted from quantum dots has low directivity, which causes a problem in which a large quantity of the light whose color is converted by quantum dots is also emitted to the light-emitting element side and does not contribute to displaying. Even though the light conversion efficiency of quantum dots themselves is improved, this does not sufficiently enhance the power efficiency and the light-extraction efficiency of display devices.

An object of one embodiment of the present invention is to provide a display device with high light-extraction efficiency. Another object is to provide a highly power-efficient display device. Another object is to provide a display device with low-power consumption. Another object is to provide a display device showing high-quality images.

Another object is to provide a highly reliable display device. Another object is to provide a display device, electronic devices, and the like with a novel structure.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a display device including a first light-emitting element, a wavelength-conversion layer, and an optically functional layer. The wavelength-conversion layer is provided to overlap with the first light-emitting element with the optically functional layer therebetween. The first light-emitting element has a function of emitting first light. The first light enters the wavelength-conversion layer and the wavelength-conversion layer has a function of emitting second light whose wavelength is longer than that of the first light. The optically functional layer has a function of transmitting the first light and reflecting the second light.

Another embodiment of the present invention is a display device including a first light-emitting element, a second light-emitting element, a wavelength-conversion layer, and an optically functional layer. The optically functional layer includes a region overlapping with the first light-emitting element and a region overlapping with the second light-emitting element. The first light-emitting element and the second light-emitting element have a function of emitting first light. The wavelength-conversion layer is provided to overlap with the first light-emitting element with the optically functional layer therebetween. The first light emitted by the second light-emitting element enters the wavelength-conversion layer and the wavelength-conversion layer has a function of emitting second light whose wavelength is longer than that of the first light. The optically functional layer has a function of transmitting the first light and reflecting the second light.

In the above-described display device, the wavelength-conversion layer includes quantum dots.

In the above-described display device, it is preferable that a reflectance of the optically functional layer with respect to light with a wavelength of 450 nm be at least less than or equal to 20%, and a reflectance of the optically functional layer with respect to light with a wavelength of 600 nm be more than or equal to 80%.

In the above-described display device, it is preferable that the optically functional layer be a dielectric multilayer film in which two kinds of dielectric films with different refractive indices are alternately stacked.

The above-described display device preferably includes a protective layer covering the first light-emitting element. The optically functional layer is preferably provided on and in contact with the protective layer and the wavelength-conversion layer is provided on and in contact with the optically functional layer.

In the above-described display device, the protective layer preferably includes a first insulating film containing an inorganic insulating material and a second insulating film containing an organic insulating material over the first insulating film. The optically functional layer is preferably provided on and in contact with the second insulating film.

The above-described display device preferably includes a coloring layer over the wavelength-conversion layer. The coloring layer has a function of transmitting the second light and blocking the first light. The coloring layer is provided on and in contact with a top surface and a side surface of the wavelength-conversion layer and on and in contact with a top surface of the optically functional layer.

The above-described display device preferably includes a first substrate over the first light-emitting element. The wavelength-conversion layer, a planarization layer, and the optically functional layer are preferably stacked in this order over a surface of the first substrate at the first light-emitting element side.

The above-described display device preferably includes a coloring layer between the first substrate and the wavelength-conversion layer. The coloring layer has a function of transmitting the second light and blocking the first light.

Effect of the Invention

With one embodiment of the present invention, a display device with high light-extraction efficiency can be provided. Alternatively, a highly power-efficient display device can be provided. Alternatively, a display device with low-power consumption can be provided. Alternatively, a display device showing high-quality images can be provided.

With one embodiment of the present invention, a highly reliable display device can be provided. Alternatively, a display device, electronic devices, and the like with a novel structure can be provided.

Note that the descriptions of the effects do not disturb the existence of other effects. Note that one embodiment of the present invention does not need to have all these effects. Note that effects other than these can be derived from the description of the specification, the drawings, the claims, and the like.

MODE FOR CARRYING OUT THE INVENTION

Figure 1A:
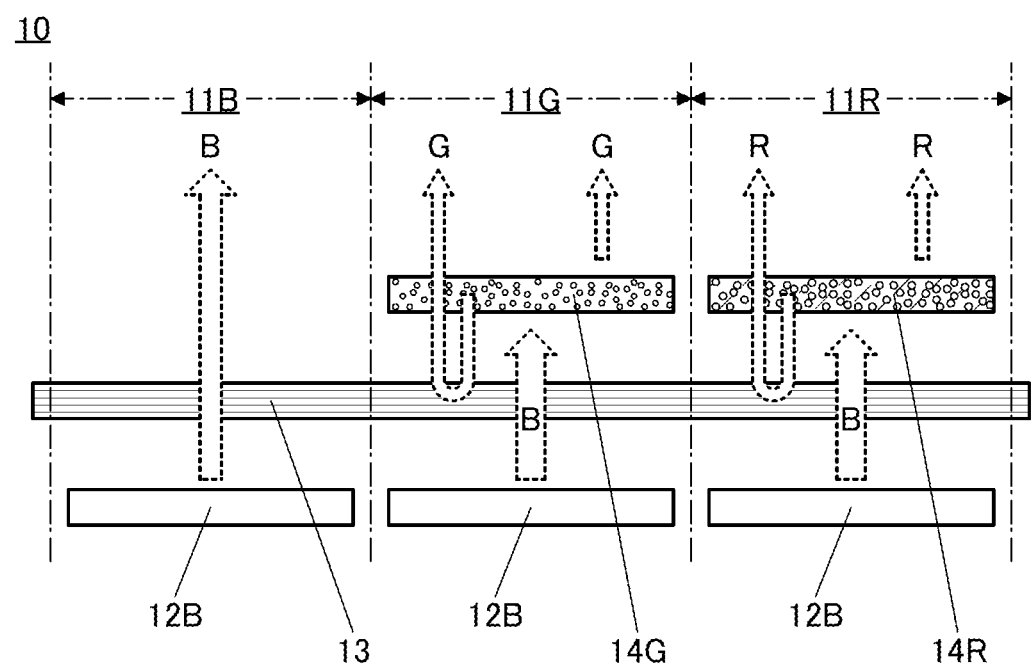
FIG. 1(A) is a diagram showing a structure example of a display device.

Embodiments will be described below with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the following description of the embodiments.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

Note that the expressions indicating directions such as "over" and "under" are basically used to correspond to the directions of drawings. However, in some cases, the direction indicating "over" or "under" in the specification does not correspond to the direction in the drawings for the purpose of description simplicity or the like. For example, when a stacked order (or formation order) of a stacked body or the like is described, even in the case where a surface on which the stacked body is provided (e.g., a formation surface, a support surface, an attachment surface, or a planarization surface) is positioned above the stacked body in the drawings, the direction and the opposite direction are referred to as "under" and "over", respectively, in some cases.

Moreover, in this specification and the like, the term "film" and the term "layer" can be interchanged with each other. For example, in some cases, the term "conductive layer" and the term "insulating layer" can be interchanged with the term "conductive film" and the term "insulating film," respectively.

Note that in this specification, an EL layer means a layer containing at least a light-emitting substance (also referred to as a light-emitting layer) or a stacked body including the light-emitting layer provided between a pair of electrodes of a light-emitting element.

In this specification and the like, a display panel which is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target such as a finger or a stylus with or to the display surface. Thus, the touch panel is one embodiment of an input/output device.

A touch panel can be referred to as, for example, a display panel (or a display device) with a touch sensor, or a display panel (or a display device) having a touch sensor function. A touch panel can include a display panel and a touch sensor panel. Alternatively, a touch panel can have a function of a touch sensor in the display panel or on the surface of the display panel.

In this specification and the like, a substrate of a touch panel on which a connector and an IC are mounted is referred to as a touch panel module, a display module, or simply a touch panel or the like in some cases.

Embodiment 1

In this embodiment, a structure example of a display device of one embodiment of the present invention is described.

One embodiment of the present invention includes a first pixel and a second pixel. The second pixel emits a first light. The first pixel emits a second light whose color is different from that of the first light.

The first pixel emits the second light whose wavelength is longer than that of the first light emitted by the second pixel. The second pixel emits, for example, blue, indigo blue, purple, or cyan light. The first pixel emits yellow, green, red, orange, magenta, or white light.

The first pixel includes a first light-emitting element, a wavelength-conversion layer, and an optically functional layer. The second pixel includes a second light-emitting element and an optically functional layer.

The first light-emitting element and the second light-emitting element each emit the first light.

When the first light enters the wavelength-conversion layer, the wavelength-conversion layer has a function of emitting the second light whose wavelength is longer than that of the first light.

The optically functional layer has a function of transmitting the first light and reflecting the second light.

The second pixel includes the second light-emitting element and the optically functional layer which are stacked. At the second pixel, the first light emitted by the second light-emitting element passes through the optically functional layer and is emitted to the outside. Thus, the second pixel emits the first light.

The first pixel, on the other hand, includes the first light-emitting element, the optically functional layer, and the wavelength-conversion layer stacked in this order. At the first pixel, the first light emitted by the first light-emitting element passes through the optically functional layer to enter the wavelength-conversion layer, and the second light whose wavelength is longer than that of the first light is emitted to the outside. Thus, the first pixel emits the second light whose wavelength is longer than that of the first light.

At the first pixel, among the second light emitted from the wavelength-conversion layer, the light emitted to the optically functional layer side can be reflected by the optically functional layer to be emitted to the outside. This can extract the second light to the outside efficiently. This improvement in light-extraction efficiency in a pixel can reduce the power consumption for extracting light of the same luminance.

The first light-emitting element and the second light-emitting element can have the same structure and can be manufactured with the same materials and the same process, which allows reducing manufacturing cost and improving manufacturing yield.

Note that a two-pixel structure has been shown for ease; when a structure includes three or more pixels with different colors, a full-color display can be achieved. A third pixel can have a structure including, for example, a third light-emitting element, which emits the first light, the optically functional layer, and the wavelength-conversion layer, which converts the first light to the third light. When the first light is blue light, the second light is green light, and the third light is red light, a display device can achieve displaying with high-color reproducibility.

More specific structure examples are described below with reference to drawings.

Structure Example 1

FIG. 1(A) is a schematic cross-sectional view showing a display device 10 of one embodiment of the present invention. The display device 10 includes a pixel 11B emitting blue light B, a pixel 11G emitting green light G, and a pixel 11R emitting red light R.

The pixel 11B, the pixel 11G, and the pixel 11R each include a light-emitting element 12B emitting blue light B and an optically functional layer 13 on the light path of light B emitted by the light-emitting element 12B. The optically functional layer 13 may be provided over the pixel 11B, the pixel 11G, and the pixel 11R as shown in FIG. 1(A) or may be provided separately in each pixel.

The pixel 11G includes a wavelength-conversion layer 14G on the light path of light B which passes through the optically functional layer 13. The wavelength-conversion layer 14G is provided at the position overlapping with the light-emitting element 12B with the optically functional layer 13 therebetween. The wavelength-conversion layer 14G has a function of converting blue light B entering from the light-emitting element 12B into green light G and emitting green light G.

The pixel 11R includes a wavelength-conversion layer 14R on the light path of light B which passes through the optically functional layer 13. The wavelength-conversion layer 14R is provided at the position overlapping with the light-emitting element 12B with the optically functional layer 13 therebetween. The wavelength-conversion layer 14R has a function of converting blue light B entering from the light-emitting element 12B into red light R and emitting the red light R.

The optically functional layer 13 has a function of transmitting blue light B emitted by the light-emitting element 12B and a function of reflecting green light G emitted by the wavelength-conversion layer 14G and red light R emitted by the wavelength-conversion layer 14R.

At the pixel 11B, light B emitted by the light-emitting element 12B passes through the optically functional layer 13 be emitted to the outside.

At the pixel 11G, among light G emitted by the wavelength-conversion layer 14G, the light emitted to the light-emitting element 12B side is reflected by the optically functional layer 13 and emitted to the sighting side.

Similarly, at the pixel 11R, the wavelength-conversion layer 14R emits the light R; the light which is emitted to the light-emitting element 12B side is reflected by the optically functional layer 13 and emitted to the sighting side.

As described above, the optically functional layer 13 can greatly enhance the light-extraction efficiency of the pixel 11G emitting green light and the pixel 11R emitting red light.

[Optical Layer 13]

As the optically functional layer 13, a dichroic mirror (also referred to as dielectric multilayer film mirror or multilayer film miller) can be used, and its optical property is that reflection and transmission is interchanged with respect to a threshold wavelength. It is particularly preferable to use a short pass dichroic minor, which transmits the light on the shorter wavelength side than a threshold wavelength and reflects the light on the longer wavelength side than the threshold wavelength.

Alternatively, as the optically functional layer 13, a band pass filter or an intervention filter can be used, and they transmits light in a particular wavelength range and reflects light in the other range.

As the optically functional layer 13, for example, a stacked film in which two or more kinds of dielectric films with different dielectric constants are stacked can be used. For example, it is particularly preferable to use a stacked film composed of dielectric multilayer films in which two dielectric films with different dielectric constants are alternately stacked to be 10 or more layers, preferably 20 or more layers, and further preferably 30 or more layers. Such a stacked film hardly absorbs light; thus, degradation owing to light absorption is not likely to occur and a high transmittance and a high reflectance are achieved. In addition, there is no rise in temperature with light absorption; therefore, heat does not accelerate degradation of a light-emitting element, which is preferable.

Dielectric films which can be used as the optically functional layer 13 are preferably inorganic insulating films such as a titanium oxide film (e.g., $TiO_2$, $TiO_5$), an aluminum oxide film (e.g., $Al_2O_3$), a hafnium oxide film (e.g., $HfO_2$), a magnesium fluoride film (e.g., $MgF_2$), and a silicon oxide film (e.g., $SiO_2$); these films have extremely small absorption in the wavelength region where the films are used (particularly in the range of visible light region). Organic insulating films can be used in some cases.

The dielectric films which can be used as the optically functional layer 13 can be deposited by various kinds of deposition methods such as a resistance heating evaporation method, an electron beam evaporation method, an MBE (Molecular Beam Epitaxy) method, a PLD (Pulsed Laser Deposition) method, an IBAD (Ion Beam Assisted Deposition) method, a plasma CVD (PECVD: Plasma Enhanced CVD) method, a thermal CVD (TCVD: Thermal CVD) method, an ALD (Atomic Layer Deposition) method, a PEALD (Plasma Enhanced ALD) method, and a sputtering method.

Figure 1B:
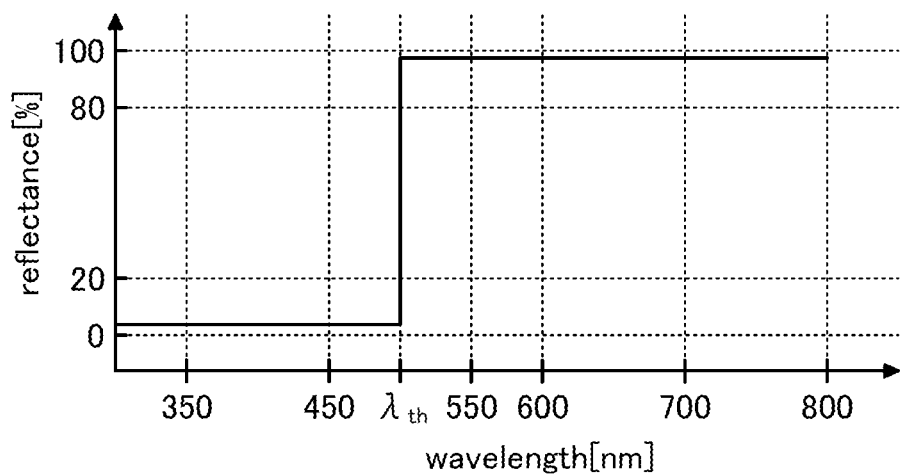
FIG. 1(B) is a diagram showing an optical property of an optically functional layer.

FIG. 1(B) shows the ideal optical property of the optically functional layer 13. In FIG. 1(B), the vertical axis represents reflectance and the horizontal axis represents wavelength. This shows an example of using as the optically functional layer 13 a short pass dichroic mirror which transmits the light in the short wavelength side with respect to a threshold wavelength $\lambda_{th}$ and reflects the light in the long wavelength side with respect to the threshold wavelength $\lambda_{th}$.

The threshold wavelength $\lambda_{th}$ is preferably at the boundary between the blue wavelength region and the green wavelength region, or in the blue wavelength region. The threshold wavelength $\lambda_{th}$ can be, for example, within the range of 460 nm to 520 nm, preferably within the range of 480 nm to 510 nm.

When the threshold wavelength $\lambda_{th}$ is within the blue wavelength region (e.g., 460 nm to 500 nm), the optically functional layer 13 can function as a filter transmitting only purer blue light, which enhances color reproducibility of a display device.

The reflectance of the optically functional layer 13 to light with a wavelength of 450 nm is at least less than or equal to 20%, preferably less than or equal to 15%, further preferably less than or equal to 10%, and the reflectance thereof to light with a wavelength of 600 nm is more than or equal to 80%, preferably more than or equal to 85%, further preferably more than or equal to 90%. When optical characteristics of the optically functional layer 13 depend on the angle of incidence, at least the reflectance to the normal incidence light is preferably in the above-described range.

Figure 2A:
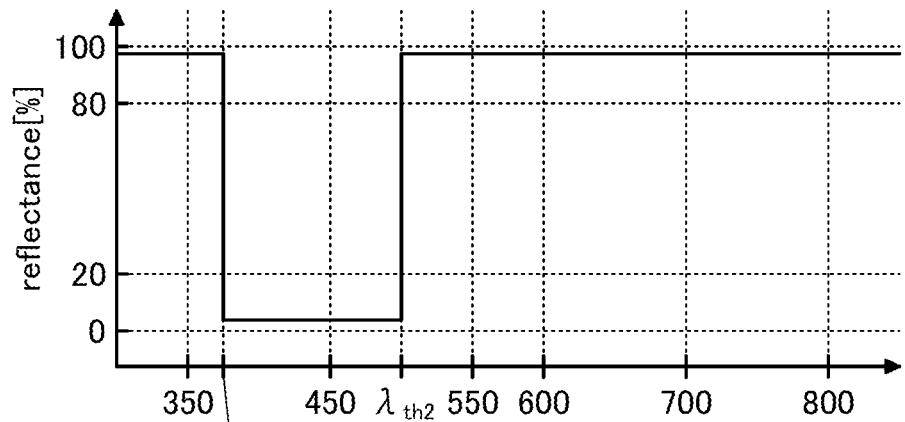
FIG. 2(A) to FIG. 2(C) are diagrams showing optical properties of an optically functional layer.

FIG. 2(A) shows the ideal optical property of the case where a band pass filter is used as the optically functional layer 13; the band-pass filter transmits the light in the wavelength region between a threshold wavelength $\lambda_{th1}$ and a threshold wavelength $\lambda_{th2}$.

The threshold wavelength $\lambda_{th1}$ in the short wavelength side can be a wavelength in the visible light region. The threshold wavelength $\lambda_{th1}$ can be a wavelength within the range of 350 nm to 440 nm, preferably within the range of 360 nm to 420 nm. For a preferable value of the threshold wavelength $\lambda_{th2}$ in the long wavelength side, the threshold wavelength $\lambda_{th}$ of the dichroic mirror in FIG. 1(B) can be referred to.

Figure 2B:
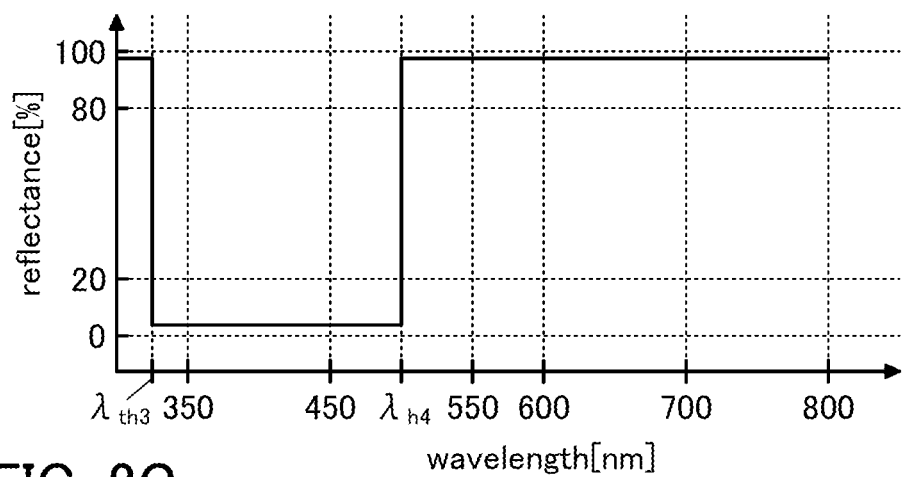

FIG. 2(B) shows an example in which light in the near ultraviolet region (e.g., less than 350 nm) is transmitted. By the use of light in the near ultraviolet region besides light in the visible light region, the amount of light which enters the wavelength-conversion layer 14G and the wavelength-conversion layer 14R can be increased, which enhances the light-emitting efficiency and power efficiency.

A threshold wavelength $\lambda_{th3}$ in the short wavelength side is more than or equal to 250 nm and less than 350 nm, preferably more than or equal to 300 nm and less than 350 nm. For a preferable value of a threshold wavelength $\lambda_{th4}$ in the long wavelength side, the above-described threshold wavelength $\lambda_{th}$ can be referred to.

When an element emitting near-ultraviolet light is used as the light-emitting element 12B and a multilayer film transmitting near-ultraviolet light is used as the optically functional layer 13, the blue pixel 11B is preferably provided with a color filter transmitting blue light, an insulating film absorbing near-ultraviolet light, or the like so that near-ultraviolet light does not reach user's eyes.

Figure 2C:
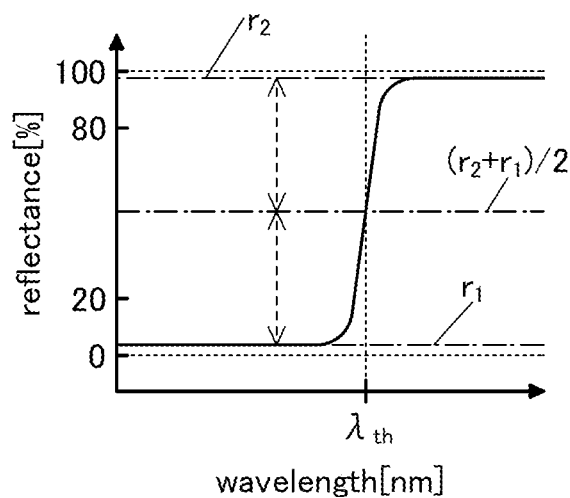

Though ideal optical properties of the optically functional layer 13 are shown in FIG. 1(B), FIG. 2(A), and FIG. 2(B), the actual reflectance of the optically functional layer 13 gradually changes with respect to wavelength as shown in FIG. 2(C). In that case, the threshold wavelength $\lambda_{th}$ of the optically functional layer 13 can be the wavelength shown below. When the reflectance of the transmitting region side is $r_1$ and the reflectance of the reflection region side is $r_2$, the threshold wavelength $\lambda_{th}$ is the median wavelength of them $(r_2+r_1/2)$ as shown in FIG. 2(C). When the reflectance of the transmitting region and the reflection region depends on a wavelength and it cannot be decided in one value, $r_1$ can be the minimum value or average value of the transmittance in the transmitting region and $r_2$ can be the maximum value or average value of the reflectance of the reflection region.

[Wavelength-Conversion Layers 14G and 14R]

For the wavelength-conversion layer 14G and the wavelength-conversion layer 14R (hereinafter also collectively referred to as the wavelength-conversion layer 14), fluorescent materials or quantum dots (QD) are preferably used. In particular, quantum dots can give an emission with high color purity since the emission spectrum thereof has a narrow peak width and the conversion efficiency is high. This achieves a display device with high color reproducibility and high display quality.

The wavelength-conversion layer 14 can have a structure in which a fluorescent substance or quantum dots is/are dispersed in an organic resin. As the organic resin, a curable material which transmits light emitted by the light-emitting element 12B and light emitted by the wavelength-conversion layer 14 can be used.

The wavelength-conversion layer 14 can be formed by, for example, a droplet discharge method (e.g., an inkjet method), a coating method, an imprinting method, a variety of printing methods (screen printing or offset printing), or the like. When a photosensitive resin material is used as the organic resin, the color conversion layer 14 can also be formed by application of the organic resin with a spin coat method or the like, exposure treatment, and then development treatment to shape a desired form.

Examples of a material of quantum dots are not particularly limited; the examples include a Group 14 element, a Group 15 element, a Group 16 element, a compound of a plurality of Group 14 elements, a compound of an element belonging to any of a Group 4 to a Group 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot whose composition is represented by a given ratio may be used.

Examples of the quantum dots include core-type quantum dots, core-shell quantum dots, and core-multishell quantum dots. Quantum dots have a high proportion of surface atoms and thus have high reactivity and easily aggregate together. To prevent aggregation of quantum dots and increase dispersiveness to a dispersion medium, it is preferable that a protective agent be attached to, or a protective group be provided at the surfaces of quantum dots. This can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size becomes smaller; thus, the emission wavelengths of the quantum dots can be adjusted over a wavelength range of a spectrum of an ultraviolet region, a visible light region, and an infrared region by changing the size of quantum dots. The size (diameter) of the quantum dots are within the range of 0.5 nm to 20 nm, preferably within the range of 1 nm to 10 nm, for example. The emission spectra are narrowed as the size distribution of the quantum dots gets smaller, and thus light can be obtained with high color purity. The shape of the quantum dots is not particularly limited to a ballistic shape and may be a spherical shape, a rod shape, a circular shape, or the like. Quantum rods, which are rod-shaped quantum dots, have a function of emitting directional light.

[Light-Emitting Element 12B]

The light-emitting element 12B emits blue light B. As the light-emitting element 12B, for example, a self-luminous light-emitting element such as an organic EL element (OLED: Organic Light Emitting Diode), a light-emitting diode (LED: Light Emitting Diode), a QLED (Quantum-dot Light Emitting Diode), or a semiconductor laser can be suitably used. In particular, an organic EL element is preferably used. As the light-emitting element 12B, a light-emitting element emitting near-ultraviolet light in addition to or instead of blue light can be used.

A structure example which can be used for the light-emitting element 12B is shown.

Figure 3A:
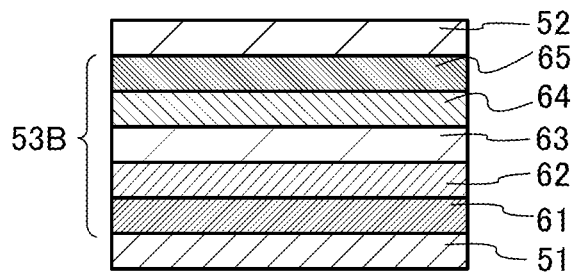
FIG. 3(A) to FIG. 3(D) are diagrams showing structure examples of a light-emitting element.

FIG. 3(A) shows a specific example of a light-emitting element with a single structure. A light-emitting element illustrated in FIG. 3(A) includes an EL layer 53B between a first electrode 51 and a second electrode 52; in the EL layer 53B, a hole-injection layer 61, a hole-transport layer 62, a light-emitting layer 63, an electron-transport layer 64, and an electron-injection layer 65 are stacked in this order from the first electrode 51 side.

The light-emitting layer 63 at least includes a light-emitting substance emitting blue light. The light-emitting substance is not particularly limited; a substance emitting fluorescence (a fluorescent material), a substance emitting phosphorescence (a phosphorescent material), a substance exhibiting thermally activated delayed fluorescence (a thermally activated delayed fluorescent (TADF) material), an inorganic compound (e.g., a quantum dot material), or the like can be used.

The first electrode 51 and the second electrode 52 can each be a transparent electrode, a transmissive and reflective electrode, or a reflection electrode. For example, the visible light transmittance of the transparent electrode is more than or equal to 40%; the visible light reflectance of the transmissive and reflective electrode is within the range of 20% to 80%, preferably within the range of 40% to 70%; and the visible light reflectance of the reflection electrode is within the range of 40% to 100%, preferably within the range of 70% to 100%. These transmittance and reflectance are enough to be at least for the light emitted by the light-emitting layer 63; these transmittance and reflectance may be for the whole visible light region.

Figure 3B:
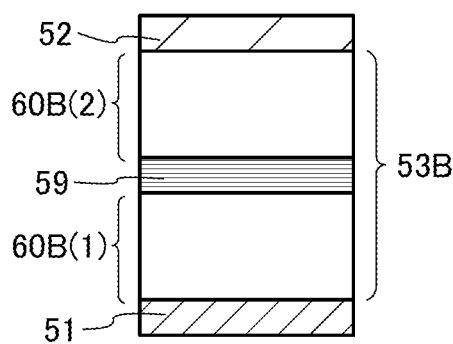
Figure 3C:
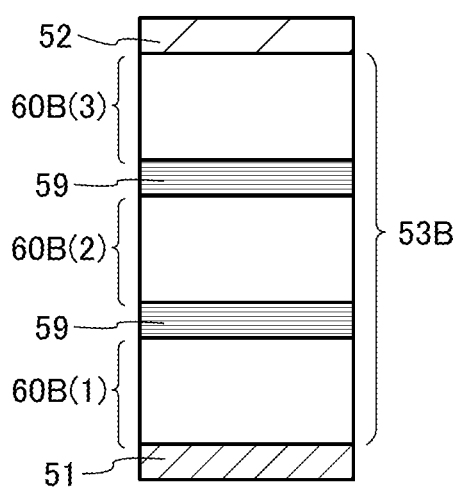
Figure 3D:
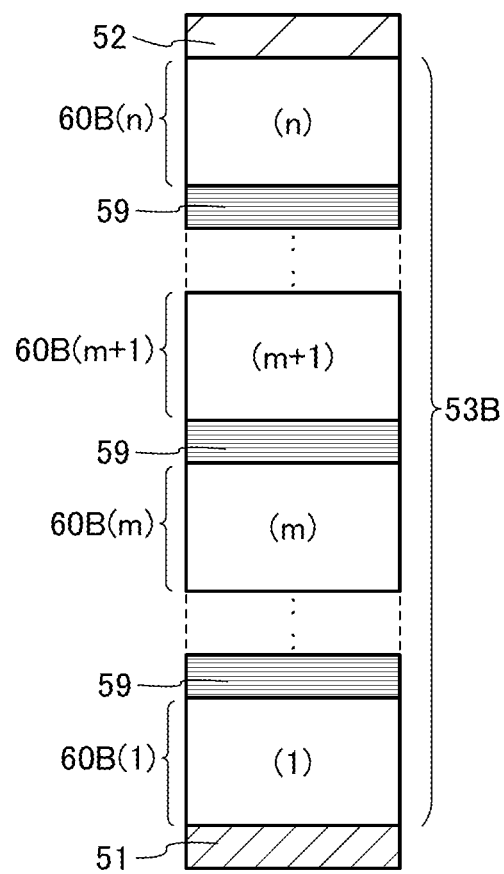

FIG. 3(B) to FIG. 3(D) show specific examples of tandem-structured light-emitting elements. The light-emitting elements shown in FIG. 3(B) to FIG. 3(D) include a plurality of light-emitting units between the first electrode 51 and the second electrode 52. A charge-generation layer 59 is preferably provided between two light-emitting units. Each light-emitting unit emits blue light. Note that the plurality of light-emitting units may contain the same light-emitting substance or different light-emitting substances.

For example, FIG. 3(B) shows that the EL layer 53B includes the charge-generation layer 59 between a light-emitting unit 60B(1) and a light-emitting unit 60B(2).

The charge-generation layer 59 has a function of injecting electrons into one of the light-emitting unit 60B(1) and the light-emitting unit 60B(2), and injecting holes to the other of the light-emitting unit 60B(1) and the light-emitting unit 60B(2) when a voltage is applied to the first electrode 51 and the second electrode 52. In FIG. 3(B), when a voltage is applied to the first electrode 51 and the second electrode 52 so that the first electrode 51 has a higher potential than the second electrode 52, the charge-generation layer 59 injects electrons into the light-emitting unit 60B(1) and holes into the light-emitting unit 60B(2).

Note that in terms of light-extraction efficiency, the charge-generation layer 59 preferably transmits visible light (specifically, the visible light transmittance of the charge-generation layer 59 is preferably 40% or higher). Furthermore, the charge-generation layer 59 functions even when having lower conductivity than the first electrode 51 or the second electrode 52.

The EL layer 53B shown in FIG. 3(C) includes the charge-generation layer 59 between the first light-emitting unit 60B(1) and the second light-emitting unit 60B(2), and another charge-generation layer 59 between the second light-emitting unit 60B(2) and a third EL layer 53B(3). The light-emitting element shown in FIG. 3(D) includes n EL layers (n is a natural number of 2 or more), and the charge-generation layer 59 between each EL layer.

The behavior of electrons and holes in the charge-generation layer 59 is described; the charge-generation layer is provided between a light-emitting unit 60B(m) and a light-emitting unit 60B(m+1). When a voltage higher than the threshold voltage of the light-emitting element is applied between the first electrode 51 and the second electrode 52, holes and electrons are generated in the charge-generation layer 59; the holes move to the light-emitting unit 60B(m+1) provided on the second electrode 52 side; and the electrons move to the light-emitting unit 60B(m) provided on the first electrode 51 side. Holes injected into the light-emitting unit 60B(m+1) are recombined with the electrons injected from the second electrode 52 side, so that a light-emitting substance contained in the light-emitting unit 60B(m+1) emits light. Electrons injected into the light-emitting unit 60B(m) are recombined with holes injected from the first electrode 51 side, so that the light-emitting substance included in the light-emitting unit 60B(m) emits light. Thus, the holes and electrons generated in the charge-generation layer 59 cause light emission in different light-emitting units.

When light-emitting units are provided in contact with each other and this shapes the same structure as a charge-generation layer, light-emitting units can be provided in contact with each other without a charge-generation layer therebetween. For example, when a charge-generation region is formed over a surface of the light-emitting unit, another light-emitting unit can be provided in contact with the surface.

A tandem-structured light-emitting element has higher current efficiency than a single-structured light-emitting element, and needs a smaller amount of current when the devices emit light with the same luminance. Accordingly, the lifetime of the light-emitting element is long, and the display device can have high reliability.

A light-emitting substance of each light-emitting unit is not particularly limited. To improve reliability, a plurality of fluorescent light-emitting units are preferably stacked. Alternatively, one or more fluorescent light-emitting unit(s) and one or more phosphorescent light-emitting unit(s) may be stacked.

The first electrode 51 may be a reflecting electrode (reflection electrode) and the second electrode 52 may be a transmitting and reflecting electrode to form a microcavity structure in order to enhance only blue light. With a microcavity structure, light emitted from the light-emitting layer included in the EL layer 53B can be resonated between the electrodes and emission obtained through the second electrode 52 can be intensified.

Between the first electrode 51 and the second electrode 52, a light-transmitting conductive film (transparent conductive film) is used as an optical-adjustment layer; and the optical adjustment can be performed by controlling the thickness of the transparent conductive film. The optical-adjustment layer can be regarded as part of the light-emitting element. For example, the first electrode 51 may have a stacked structure of the reflection electrode and the optical-adjustment layer. The optical distance between the first electrode 51 and the second electrode 52 may be adjusted by using one or a plurality of functional layer(s) included in the EL layer 53B.

Specifically, when the wavelength of light obtained from the light-emitting layer is X, the distance between the first electrode 51 and the second electrode 52 is preferably adjusted to around $m\lambda/2$ (m is a natural number).

To amplify desired light (wavelength: $\lambda$) obtained from the light-emitting layer, the optical distance from the first electrode 51 to a region where the desired light is obtained in the light-emitting layer (light-emitting region) and the optical distance from the second electrode 52 to the region where the desired light is obtained in the light-emitting layer (light-emitting region) are preferably adjusted in the neighborhood of $(2m'+1)\lambda/4$ ($m'$ is a natural number). Here, the light-emitting region refers to a region where holes and electrons are recombined in the light-emitting layer.

With such optical adjustment, the spectrum of single-color light (blue light in this embodiment) emitted from the light-emitting layer can be narrowed and light emission with high color purity can be obtained.

However, in the above case, the optical distance between the first electrode 51 and the second electrode 52 is, to be exact, the total thickness from a reflective region in the first electrode 51 to a reflective region in the second electrode 52. However, it is difficult to precisely determine the reflective regions in the first electrode 51 and the second electrode 52; thus, it is assumed that the above effect can be sufficiently obtained with given positions in the first electrode 51 and the second electrode 52 being supposed to be reflective regions. Furthermore, the optical distance between the first electrode 51 and the light-emitting layer from which the desired light is obtained is, to be exact, the optical distance between the reflective region in the first electrode 51 and the light-emitting region in the light-emitting layer from which the desired light is obtained. However, it is difficult to precisely determine the reflective region in the first electrode 51 and the light-emitting region in the light-emitting layer from which the desired light is obtained; thus, it is assumed that the above effect can be sufficiently obtained with a given position in the first electrode 51 being supposed to be the reflective region and a given position in the light-emitting layer from which the desired light is obtained being supposed to be the light-emitting region.

With the microcavity structure, emission intensity of blue light in the front direction can be increased, whereby power consumption can be reduced.

The above is the description of Structure example 1.

Structure Example 2

Next, a specific structure example of the display device of one embodiment of the present invention is described below.

Structure Example 2-1

Figure 4A:
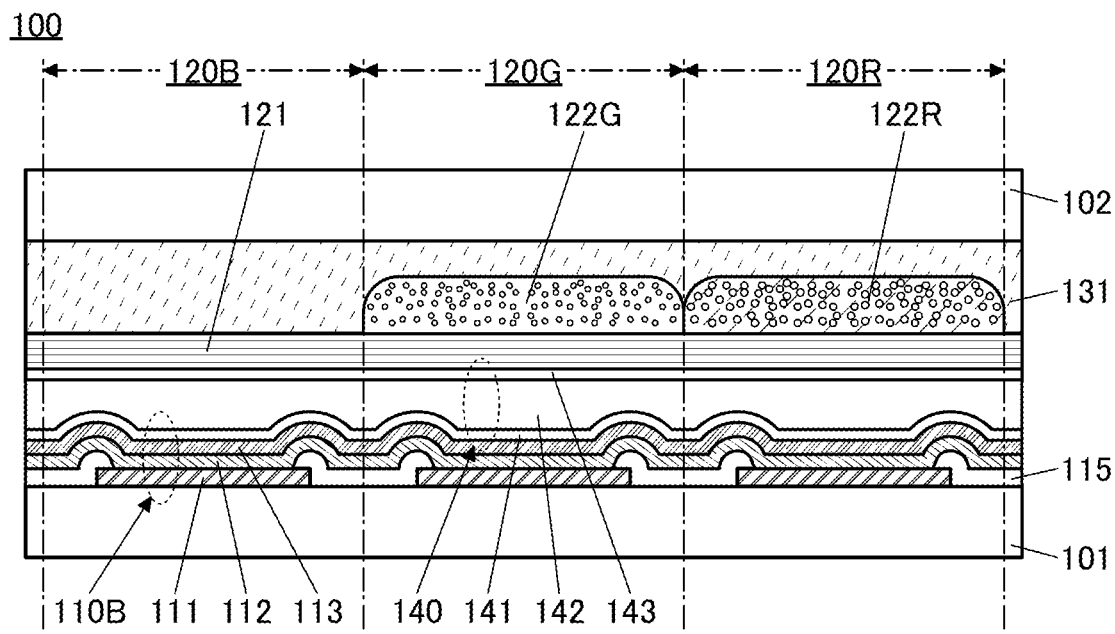
FIG. 4(A) and FIG. 4(B) are diagrams showing structure examples of a display device.

FIG. 4(A) is a schematic cross-sectional view of a display device 100. FIG. 4(A) shows a blue pixel 120B, a green pixel 120G, and a red pixel 120R.

In FIG. 4(A), the display device 100 includes, between a substrate 101 and a substrate 102, three light-emitting elements 110B, a protective layer 140, an optically functional layer 121, a wavelength-conversion layer 122G, a wavelength-conversion layer 122R, and the like. The substrate 101 and the substrate 102 are bonded by a bonding layer 131. The bonding layer 131 is provided to cover the optically functional layer 121, the wavelength-conversion layer 122G, and the wavelength-conversion layer 122R.

The light-emitting element 110B is provided in each pixel. The light-emitting element 110B includes a conductive layer 111 functioning as a pixel electrode, a conductive layer 113 functioning as a common electrode, and an EL layer 112 therebetween. The EL layer 112 includes a light-emitting material that emits blue light. The conductive layer 111 reflects visible light (at least blue light), and the conductive layer 113 transmits visible light (at least blue light). The light-emitting element 110B included in the display device 100 is a top-emission blue light-emitting element (top-emission type).

An insulating layer 115 is provided to cover the end portions of the conductive layer 111, which is provided in each pixel. The EL layer 112 and the conductive layer 113 are provided over each pixel. This structure is preferable because it removes the necessity to form the EL layer 112 separately in each pixel and easily achieves high resolution and high aperture ratio.

The protective layer 140 is provided to cover the light-emitting element 110B. The protective layer 140 has a stacked-layered structure in which an insulating layer 141, an insulating layer 142, and an insulating layer 143 are stacked in this order.

The insulating layer 141 and the insulating layer 143 are preferably an inorganic insulating film which has a light-transmitting property and in which impurities such as water are less likely to be diffused. For example, it is preferable to use a single layer or stacked layers of an oxide insulating film, a nitride insulating film, an oxynitride insulating film, or the like. Typically, a silicon oxide film, a silicon oxynitride film, a silicon nitride film, an aluminum oxide film, an aluminum oxynitride film, an aluminum nitride film, or the like can be used.

As the insulating layer 142, a light-transmitting organic insulating film is preferably used. In particular, the insulating layer 142 preferably functions as a planarization film. The formation surface of the insulating layer 141 is generally not flat, and pinholes and low-density part may be formed in the insulating layer 141. When the insulating layer 141 is covered by the insulating layer 142 functioning as a planarization film, the formation surface of the insulating layer 143 is made smooth and substantially flat; thus, the insulating layer 143 with a high barrier property can be formed over the insulating layer 142.

The optically functional layer 121 is provided over the protective layer 140. When the formation surface of the optically functional layer 121 has, for example, large concave and convex patterns, the optical properties of the optically functional layer 121 vary at each part and desirable optical properties may not be obtained. This structure example, however, has the highly flat top surface of the protective layer 140; thus, the optically functional layer 121 can be formed on the substantially flat surface and the optically functional layer 121 with high-precision optical properties can be formed.

The wavelength-conversion layer 122G and the wavelength-conversion layer 122R are provided over the optically functional layer 121.

Structure Example 2-2

Figure 4B:
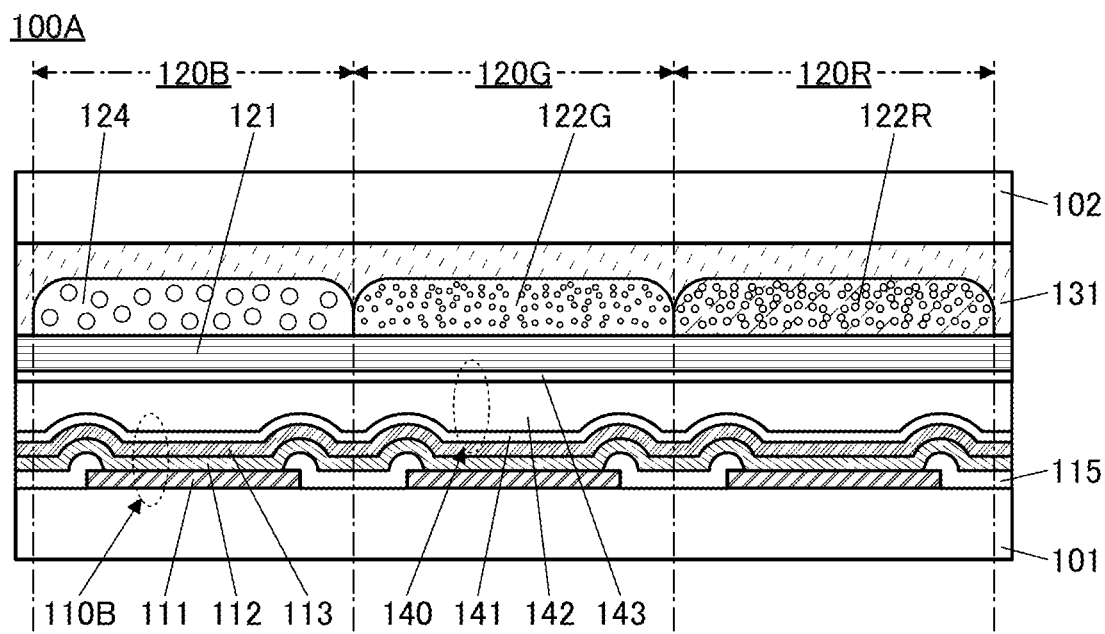

A display device 100A in FIG. 4(B) is different from the display device 100 mainly in including a diffusion layer 124.

The diffusion layer 124 is provided over the optically functional layer 121 of the pixel 120B. The diffusion layer 124 has a function of diffusing light which has high directivity from the light-emitting element 110B. The diffusion layer 124 can reduce viewing angle dependence of the pixel 120B to improve viewing angle properties of the display device. In other words, a reduction in luminance and color deviation when seen from an oblique direction to the display surface can be suppressed.

The diffusion layer 124 can diffuse the blue light entering from the pixel 120B without changing the wavelength thereof. The diffusion layer 124, for example, can have a structure in which transparent particles are dispersed in organic resin. The transparent particles can be a material which has a refractive index different from that of the organic resin and high transmittance to blue light. For example, the following are given: inorganic-material particles such as glass (e.g., $SiO_2$), titanium oxide, hafnium oxide, and aluminum oxide; and organic-material particles such as polystyrene (PS), polymethylmethacrylate (PMMA), acrylic, and polycarbonate. The grain diameter is preferably within the range of about 1 µm to 100 µm.

As the diffusion layer 124, porous materials may be used. In the resin or the like constituting the diffusion layer 124, a material in which bubbles of air, oxygen, nitrogen, rare gas, and the like are dispersed can be used or a material including inactive liquid such as a liquid crystal material, silicon oil, or fluorine-based inactive liquid (e.g., perfluorocarbon) can be used. The diffusion layer 124 may have a structure in which particles reflecting blue light (e.g., metal particles) are dispersed.

The diffusion layer 124 can be formed by a method similar to that for the wavelength-conversion layer 122G or the wavelength-conversion layer 122R.

Structure Example 2-3

Figure 5A:
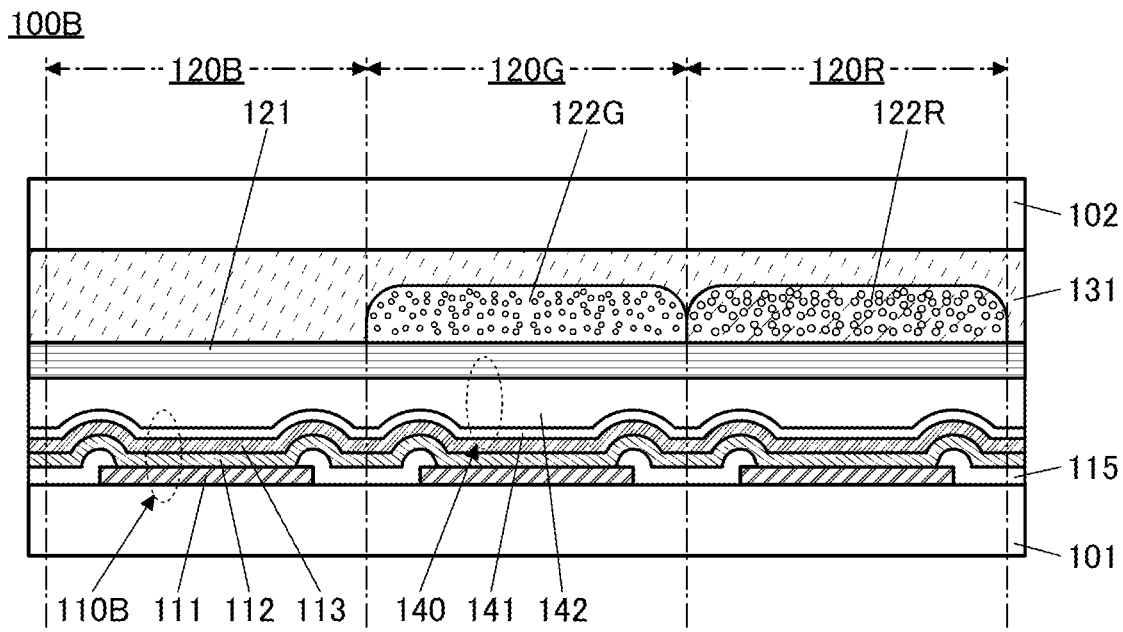
FIG. 5(A) and FIG. 5(B) are diagrams showing structure examples of a display device.

A display device 100B in FIG. 5(A) is different from the display device 100 mainly in the structure of the protective layer 140.

In this structure, the protective layer 140 in the display device 100 includes the insulating layer 141 and the insulating layer 142, and does not include the insulating layer 143.

The optically functional layer 121 in contact with the top surface of the insulating layer 142 can also serve as a barrier layer that prevents diffusion of water and the like. The optically functional layer 121 has a multilayer structure with inorganic insulating films as described above and thus has an excellent barrier property against impurities such as water.

Such a structure can simplify the fabrication process compared to that for the display device 100, leading to a reduction in manufacturing cost.

Structure Example 2-4

Figure 5B:
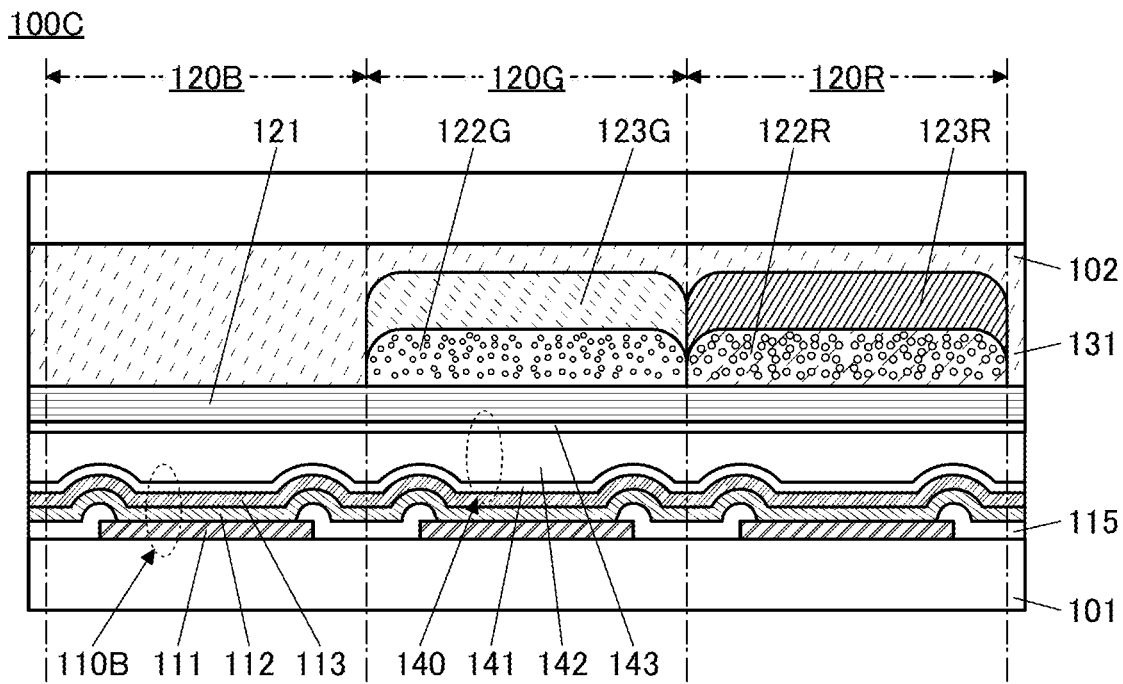

A display device 100C in FIG. 5(B) is different from the display device 100 mainly in that the display device 100C includes a coloring layer 123G and a coloring layer 123R.

The coloring layer 123G is provided to overlap with the wavelength-conversion layer 122G at the pixel 120G. The coloring layer 123R is provided to overlap with the wavelength-conversion layer 122R at the pixel 120R.

The coloring layer 123G has a function of transmitting green light and absorbing or reflecting the other light. The coloring layer 123R has a function of transmitting red light and absorbing or reflecting the other light.

Among the blue light entering the wavelength-conversion layer 122G and the wavelength-conversion layer 122R, some blue light may pass through the substrate 102 to the outside without conversion of the wavelength. The blue light may be mixed with, for example, green light or red light to reduce color purity, whereby the color reproducibility of the display device may be worsened. To prevent this, the coloring layer 123G and the coloring layer 123R are provided closer to the substrate 102 than the wavelength-conversion layer 122G and the wavelength-conversion layer 122R respectively; this prevents the emission to the outside of blue light which passes through the wavelength-conversion layer 122G or the wavelength-conversion layer 122R and prevents color reproducibility from worsening.

For the coloring layer 123G and the coloring layer 123R, a resin material containing dye or a pigment can be used.

Structure Example 2-5

Figure 6A:
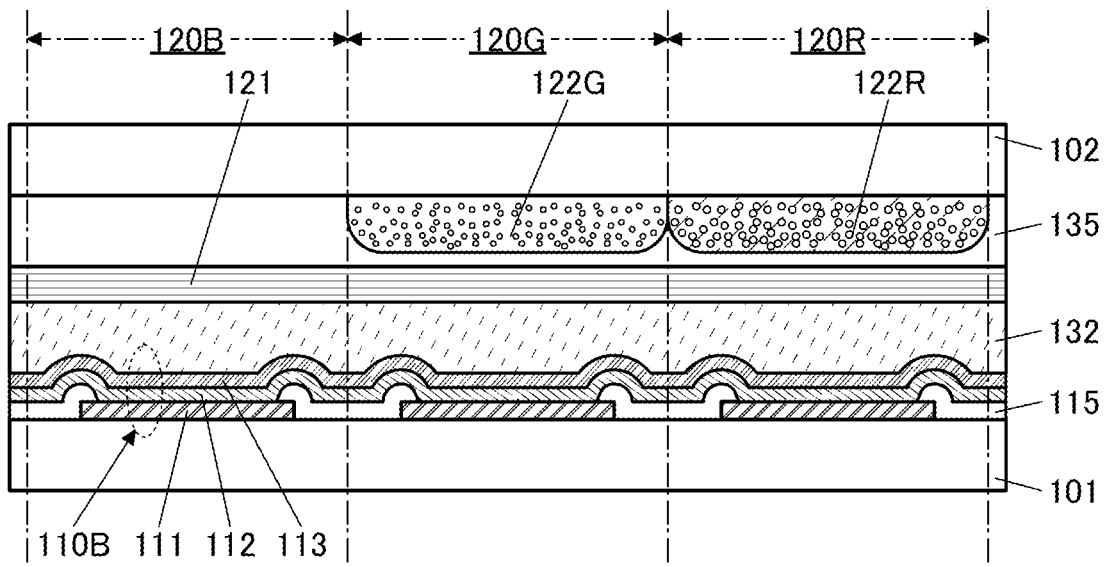
FIG. 6(A) and FIG. 6(B) are diagrams showing structure examples of a display device.

A display device 100D in FIG. 6(A) is different from the display device 100 mainly in that the wavelength-conversion layer 122G, the wavelength-conversion layer 122R, the optically functional layer 121, and the like are provided on the substrate 102 side.

The wavelength-conversion layer 122G and the wavelength-conversion layer 122R are provided on the substrate 102 surface at the light-emitting element 110B side. An insulating layer 135 is provided to cover the wavelength-conversion layer 122G and the wavelength-conversion layer 122R; the optically functional layer 121 is provided on the insulating layer 135 surface at the light-emitting element 110B side.

The insulating layer 135 preferably functions as a planarization film. This can remove the effect of the surface unevenness caused by the wavelength-conversion layer 122G and the wavelength-conversion layer 122R and makes the formation surface of the optically functional layer 121 flat, whereby it is possible to prevent the optical properties of the optically functional layer 121 from varying at each part.

A bonding layer 132, which bonds the substrate 101 and the substrate 102, is provided between the conductive layer 113 of the light-emitting element 110B and the optically functional layer 121.

The example described here shows the case where the protective layer 140 is not provided to cover the light-emitting element 110B. As described above, the optically functional layer 121 also functions as a barrier layer preventing water from entering; it is possible to preferably prevent moisture in the insulating layer 135 and the like from diffusing into the light-emitting element 110B. The protective layer 140 can be provided if necessary.

Structure Example 2-6

Figure 6B:
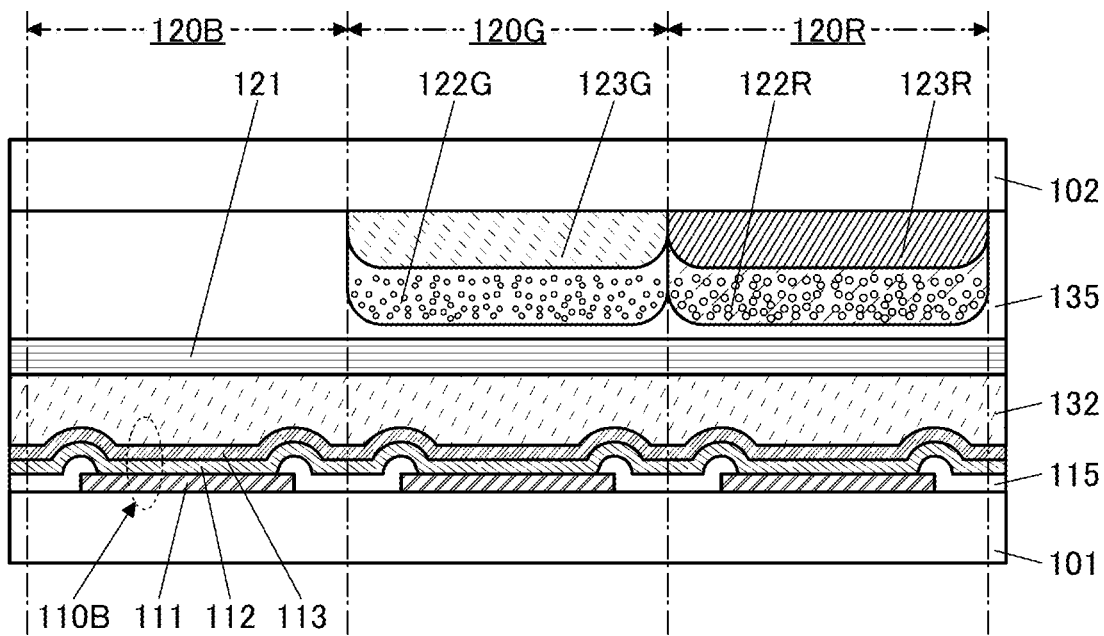

A display device 100E in FIG. 6(B) is different from the display device 100D mainly in that the display device 100E includes the coloring layer 123G and the coloring layer 123R.

The coloring layer 123G is provided between the substrate 102 and the wavelength-conversion layer 122G. The coloring layer 123R is provided between the substrate 102 and the wavelength-conversion layer 122R.

Structure Example 2-7

Figure 7A:
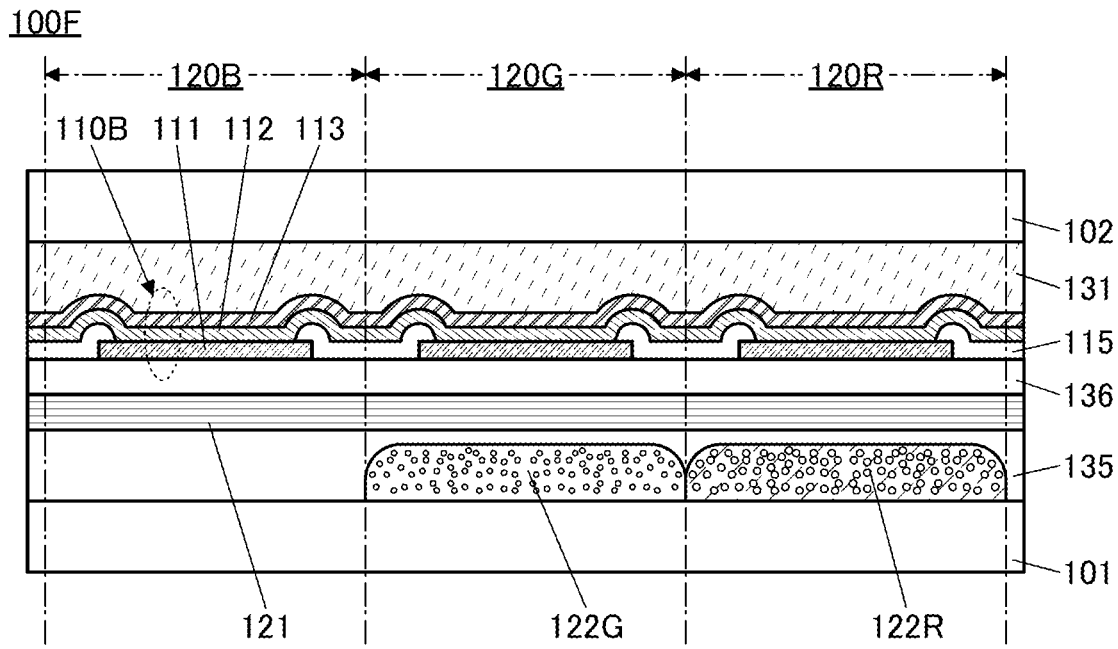
FIG. 7(A) and FIG. 7(B) are diagrams showing structure examples of a display device.

A display device 100F in FIG. 7(A) is an example in which a bottom-emission (bottom-emission type) light-emitting element is used as the light-emitting element 110B.

The wavelength-conversion layer 122G and the wavelength-conversion layer 122R are provided over the substrate 101, and the insulating layer 135, which functions as a planarization layer, is provided to cover these layers. The optically functional layer 121 and the insulating layer 136 are stacked over the insulating layer 135. Over the insulating layer 136, the light-emitting element 110B and the insulating layer 115 are provided. The bonding layer 131 between the light-emitting element 110B and the substrate 102 bonds the substrate 101 and the substrate 102.

In the light-emitting element 110B, a conductive film transmitting visible light (at least blue light) can be used as the conductive layer 111, which functions as a pixel electrode, and a conductive film reflecting visible light (at least blue light) can be used as the conductive layer 113, which functions as a common electrode. In the case of a microcavity structure, a conductive film transmissive and reflective to visible light (at least blue light) is used as the conductive layer 111.

Structure Example 2-8

Figure 7B:
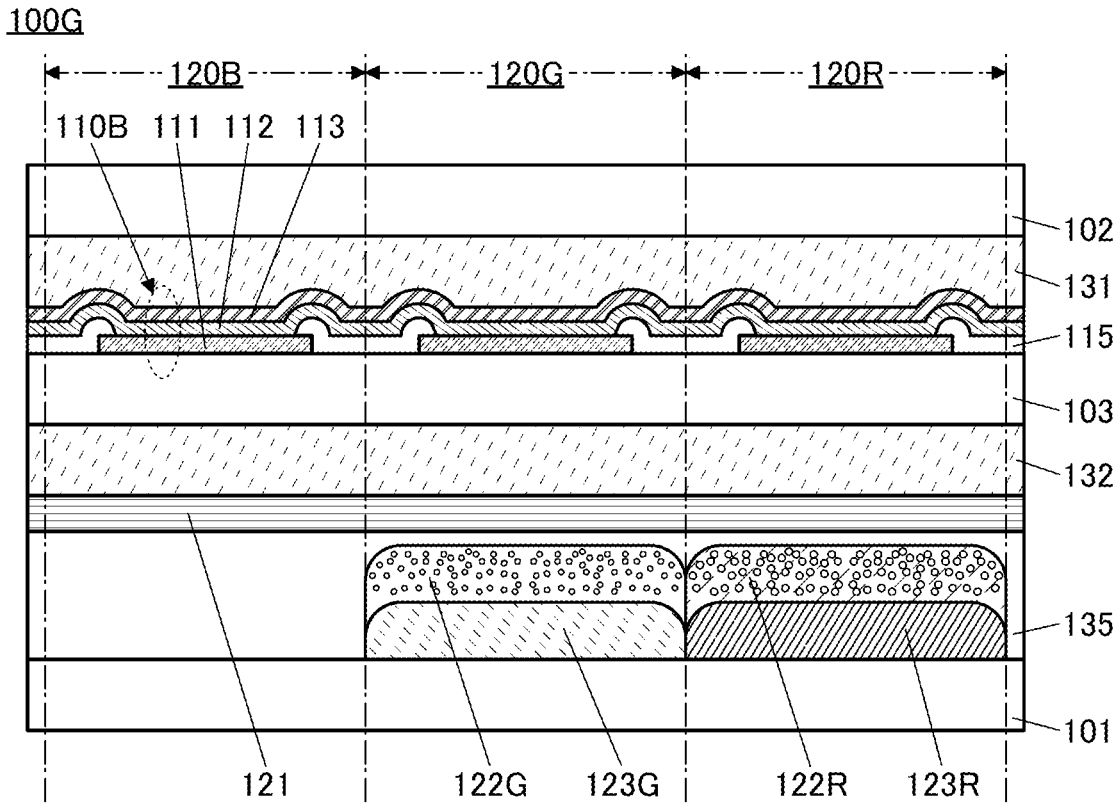

A display device 100G in FIG. 7(B) is different from the display device 100F mainly in that the substrate over which the light-emitting element 110B is provided and the substrate over which the wavelength-conversion layer and the like are provided are different from those of the display device 100F.

The bottom-emission light-emitting element 110B is provided over a substrate 103. The substrate 103 and the substrate 102 are bonded by the bonding layer 131.

The coloring layer 123G and the coloring layer 123R are provided over the substrate 101. The wavelength-conversion layer 122G is provided over the coloring layer 123G; the wavelength-conversion layer 122R is provided over the coloring layer 123R. The insulating layer 135, which functions as a planarization layer, is provided to cover these layers; the optically functional layer 121 is provided over the insulating layer 135.

The bonding layer 132 between the substrate 103 and the optically functional layer 121 bonds the substrate 101 and the substrate 103.

The above is the description of Structure example 2.

Structure Example 3

The following example shows the case where an LED element is used as a light-emitting element.

Structure Example 3-1

Figure 8A:
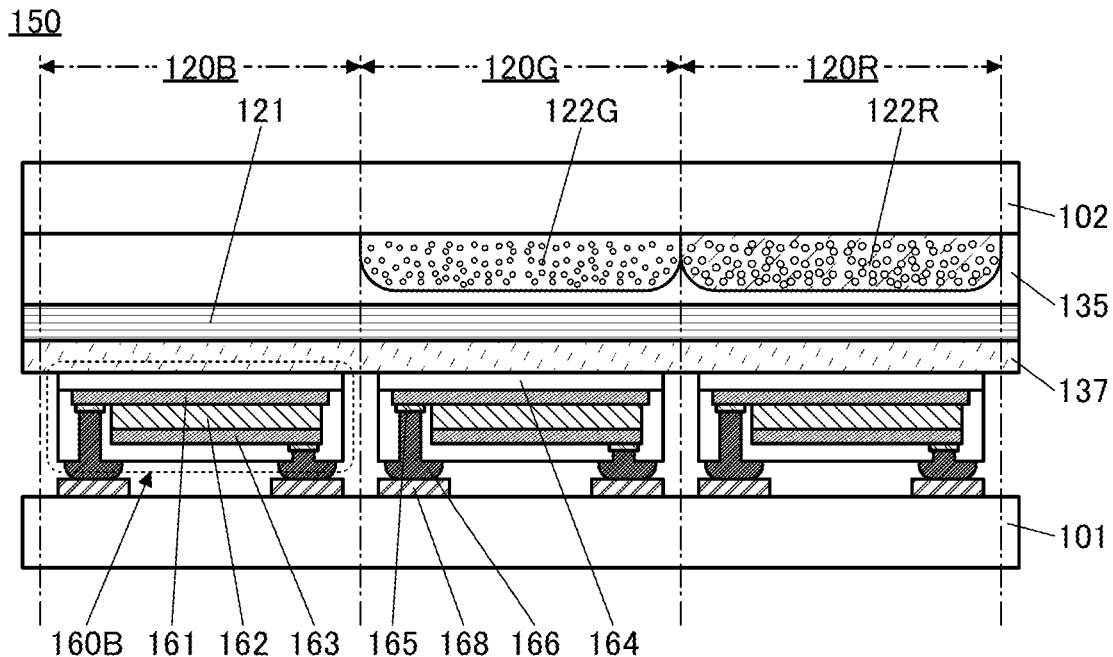
FIG. 8(A) and FIG. 8(B) are diagrams showing structure examples of a display device.

A display device 150 in FIG. 8(A) includes a light-emitting element 160B. The light-emitting element 160B is a flip-chip LED element which emits blue light. By using a flip-chip LED, a light-blocking bump and electrodes can be provided at the opposite side to the light-emitting surface, which can widen the effective light-emitting area and improve luminance and reliability; using a flip-chip LED is preferable.

The light-emitting element 160B includes a conductive layer 161, a semiconductor layer 162, a conductive layer 163, a substrate 164, and the like. The conductive layer 161 functions as one of an anode and a cathode, and the conductive layer 163 functions as the other thereof. The semiconductor layer 162 between the conductive layer 161 and the conductive layer 163 includes at least an n-type semiconductor layer, a light-emitting layer, and a p-type semiconductor layer. Since light is extracted to the substrate 164 side in the light-emitting element 160B, a light-transmitting material can be used for the substrate 164 and the conductive layer 161. As the substrate 164, a sapphire substrate can be typically used.

The smaller the chip size of the light-emitting element 160B is and the narrower the light-emitting elements 160B are arranged, a high-resolution display device can be achieved. The chip size of the light-emitting element 160B is, for example, less than or equal to 1 mm, preferably less than or equal to 500 µm, more preferably less than or equal to 300 µm, further preferably less than or equal to 100 µm, still further preferably less than or equal to 50 µm, and preferably greater than or equal to 1 µm. For example, a chip with a size less than 100 µm can be called a micro LED.

As the semiconductor layer 162, for example, a material including a Group 13 nitride-based compound semiconductor is preferably used. A GaN-based material represented as $In_xAl_yGa_{(1-x-y)}N$ (x is within the range of 0 to 1, y is within the range of 0 to 1, and x+y is within the range of 0 to 1) can be used, for example.

Each terminal 165 is connected to the conductive layer 161 and the conductive layer 163, and is connected to a terminal 168 on the substrate 101 through a bump 166. The light-emitting elements 160B are provided with current depending on gradation through terminals over the substrate 101, whereby the light-emitting elements 160B can emit light with desirable luminance.

It is preferable to use, as the substrate 101, a substrate with a pixel circuit that is preferably composed of a transistor, a capacitor, a wiring, and the like. Thus, an active-matrix display device can be achieved. As the transistor, a transistor with an oxide semiconductor described below is preferably used.

The wavelength-conversion layer 122G and the wavelength-conversion layer 122R are provided on the substrate 102 surface at the light-emitting 160B side; the insulating layer 135 is provided to cover these layers; the optically functional layer 121 is further provided.

The substrate 101 and the substrate 102 are bonded to each other by the bonding layer 137. In the structure shown here, as the bonding layer 137, an optical clear adhesive (OCA) is used to bond the substrate 164 surface of the light-emitting element 160B and the optically functional layer 121 surface.

Structure Example 3-2

Figure 8B:
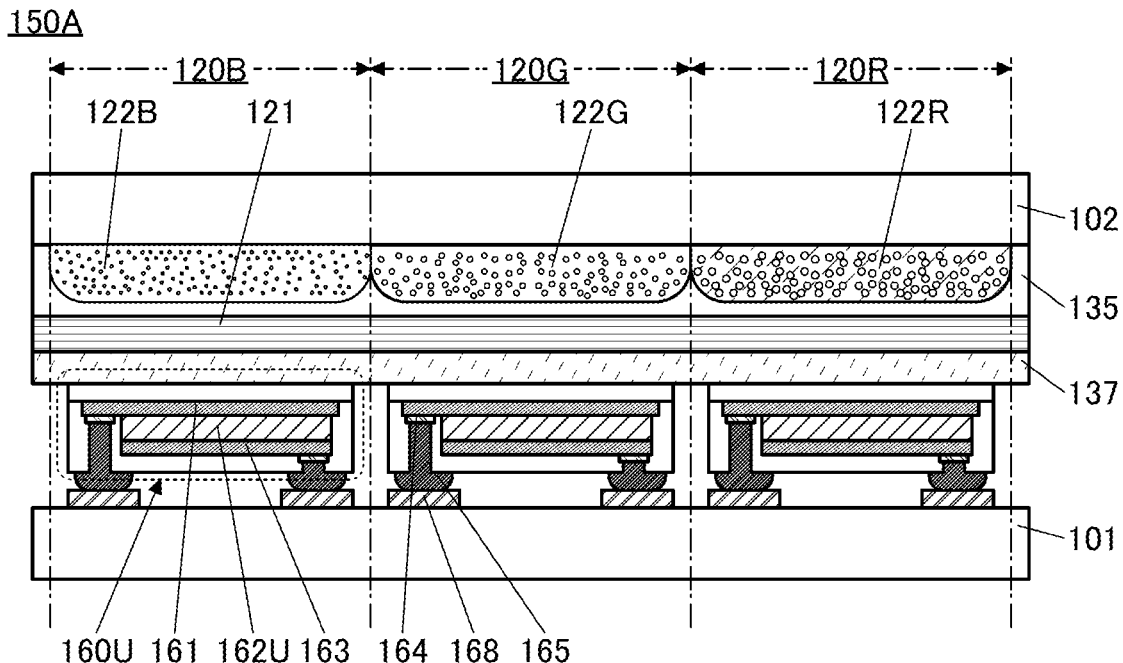

FIG. 8(B) shows a display device 150A that is an example in which a light-emitting element emitting near-ultraviolet light or violet light is used.

A light-emitting element 160U emitting near-ultraviolet light or violet light includes a semiconductor layer 162U. The semiconductor layer 162U preferably includes a semiconductor material such as a GaN-based material, a ZnO-based material, or the like.

The optically functional layer 121 can be an optically structured multilayer film that transmits near-ultraviolet light or violet light and reflects light having longer wavelength than that of blue light.

At the blue pixel 120B, the wavelength-conversion layer 122B is provided. The wavelength-conversion layer 122B has a function of converting near-ultraviolet light or violet light entering from the light-emitting element 160U to blue light and of emitting the blue light. When the wavelength-conversion layer 122B includes quantum dots, quantum dots with a smaller size than those for the wavelength-conversion layer 122G can be used.

The above is the description of Structure example 3.

Each pixel in the display device shown in this embodiment can have a light-emitting element with a similar structure, which can facilitate the manufacturing process and improve production yield compared to the case where a different light-emitting element is provided in each pixel. When quantum dots are used for the wavelength-conversion layer, light emission with extremely high purity can be obtained; the display device which is excellent in color reproducibility and display quality can be achieved. When a low-power light-emitting element such as an organic EL element or an LED is used for the light-emitting element and quantum dots with high conversion efficiency are used for the wavelength-conversion layer, an extremely power-efficient display device can be achieved. Particularly, a tandem structure, in which a plurality of light-emitting elements are stacked, is used for an organic EL element, whereby a low-power and highly reliable display device can be achieved.

At least part of this embodiment can be implemented in combination with the other embodiments described in this specification as appropriate.

Embodiment 2

In this embodiment, a specific structure example of the display device of one embodiment of the present invention is described.

Structure Example

Figure 9A:
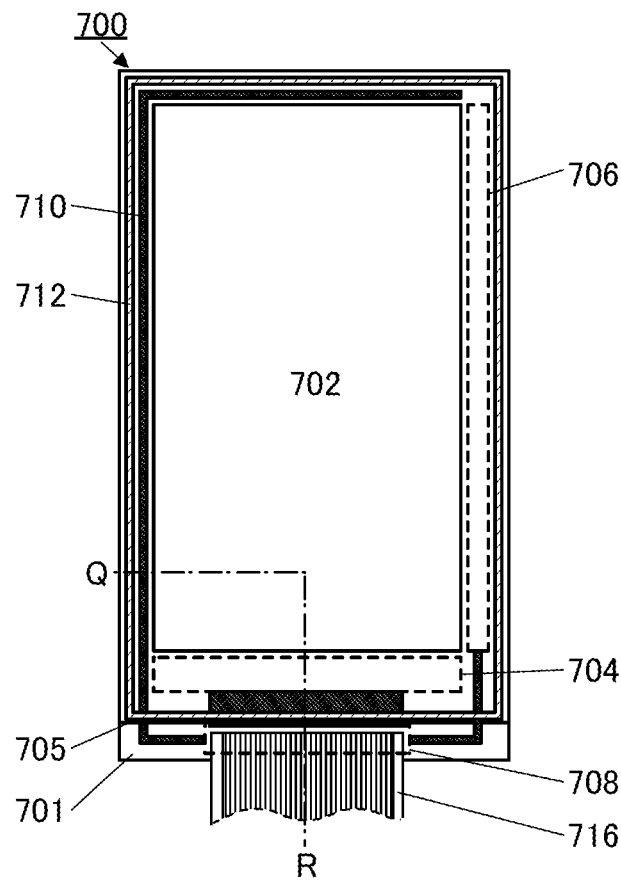
FIG. 9(A) to FIG. 9(C) are diagrams showing structure examples of a display device.

FIG. 9(A) shows a top view of a display device 700. The display device 700 includes a first substrate 701 and a second substrate 705, which are bonded by a sealant 712. In a region sealed by the first substrate 701, the second substrate 705, and the sealant 712, a pixel portion 702, a source driver circuit portion 704, and a gate driver circuit portion 706 are provided over the first substrate 701. A plurality of display elements are provided in the pixel portion 702.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a wiring 710.

A plurality of gate driver circuit portions 706 may be provided. Alternatively, the gate driver circuit portion 706 and the source driver circuit portion 704 may be formed separately on semiconductor substrates or the like to obtain packaged IC chips. The IC chip can be mounted over the first substrate 701 or on the FPC 716.

Transistors including an oxide semiconductor are preferably used as the transistor included in the pixel portion 702, the source driver circuit portion 704, and the gate driver circuit portion 706.

The light-emitting element of one embodiment of the present invention can be used for the display element in the pixel portion 702. As an example of the light-emitting element, a self-luminous light-emitting element such as a light-emitting diode (LED), an organic LED (OLED), a quantum-dot LED (QLED), or a semiconductor laser can be given.

Figure 9B:
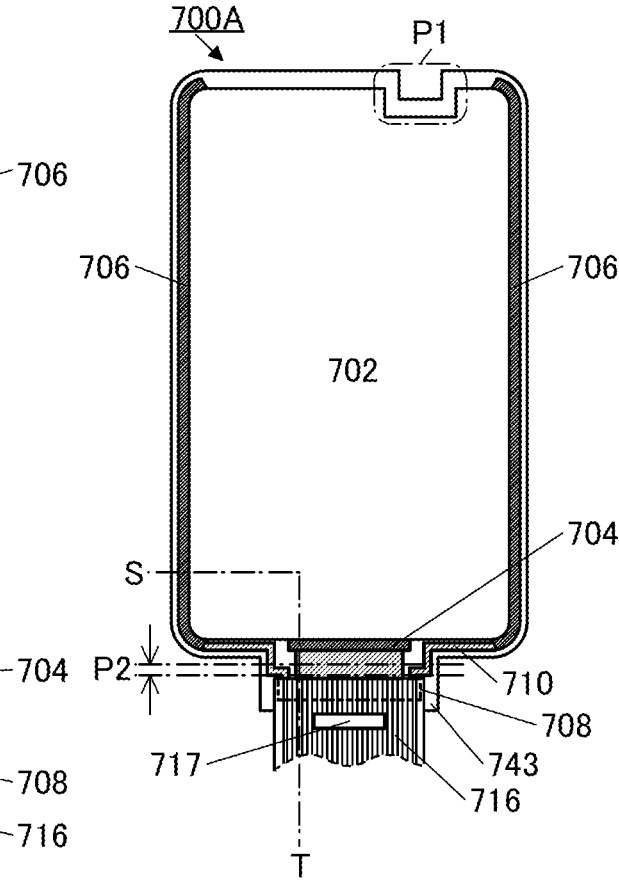

A display device 700A in FIG. 9(B) is an example of a display device that uses a flexible resin layer 743 instead of the first substrate 701 and that can be used as a flexible display.

In the display device 700A, the pixel portion 702 does not have a rectangular shape but has arc-shaped corner portions. The display device 700A includes a notch portion in which part of the pixel portion 702 and part of the resin layer 743 are cut as shown in a region P1 in FIG. 9(B). A pair of gate driver circuit portions 706 is provided on opposite sides with the pixel portion 702 therebetween. In addition, the gate driver circuit portions 706 are provided along an arc-shaped outline at the corners of the pixel portion 702.

The resin layer 743 has a shape in which a portion provided with the FPC terminal portion 708 is projected. Furthermore, part of the resin layer 743 that includes the FPC terminal portion 708 can be bent backward in a region P2 in FIG. 9(B). When a portion of the resin layer 743 is folded back, the display device 700A can be mounted on an electronic device with the FPC 716 overlapping with the rear side of the pixel portion 702, so that the space of the electronic device can be saved.

In addition, an IC 717 is mounted on the FPC 716, which is connected to the display device 700A. The IC 717 has a function of a source driver circuit, for example. In this case, a structure can be employed in which the source driver circuit portion 704 in the display device 700A includes at least one of a protection circuit, a buffer circuit, a demultiplexer circuit, and the like.

Figure 9C:
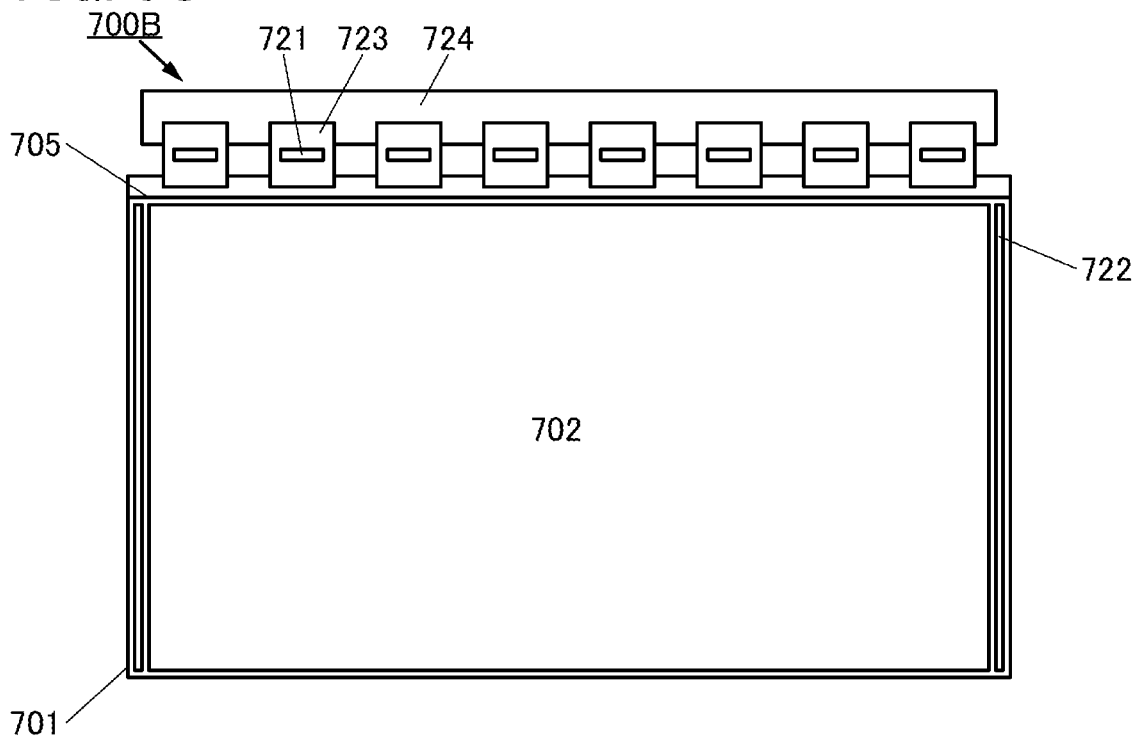

A display device 700B in FIG. 9(C) is a display device that can be suitably used for an electronic device with a large screen. For example, the display device 700B can be suitably used for a television device, a monitor device, a personal computer (including a laptop personal computer and a desktop personal computer), a tablet terminal, digital signage, and the like.

The display device 700B includes a plurality of source driver ICs 721 and a pair of gate driver circuit portions 722.

The plurality of source driver ICs 721 are attached to respective FPCs 723. In addition, in each of the plurality of FPCs 723, one terminal is connected to the substrate 701, and the other terminal is connected to a printed circuit board 724. When the FPCs 723 are bent, mounting on an electronic device can be performed with the printed circuit board 724 placed on the rear side of the pixel portion 702, so that the space of the electronic device can be saved.

In contrast, the gate driver circuit portions 722 are provided over the substrate 701. Thus, an electronic device with a narrow frame can be obtained.

With such a structure, a large high-resolution display device can be achieved. For example, a display device with a diagonal screen size of 30 inches or more, 40 inches or more, 50 inches or more, or 60 inches or more can be obtained. Furthermore, a display device with extremely high resolution such as 4K2K or 8K4K can be obtained.

Cross-Sectional Structure Example

Figure 10:
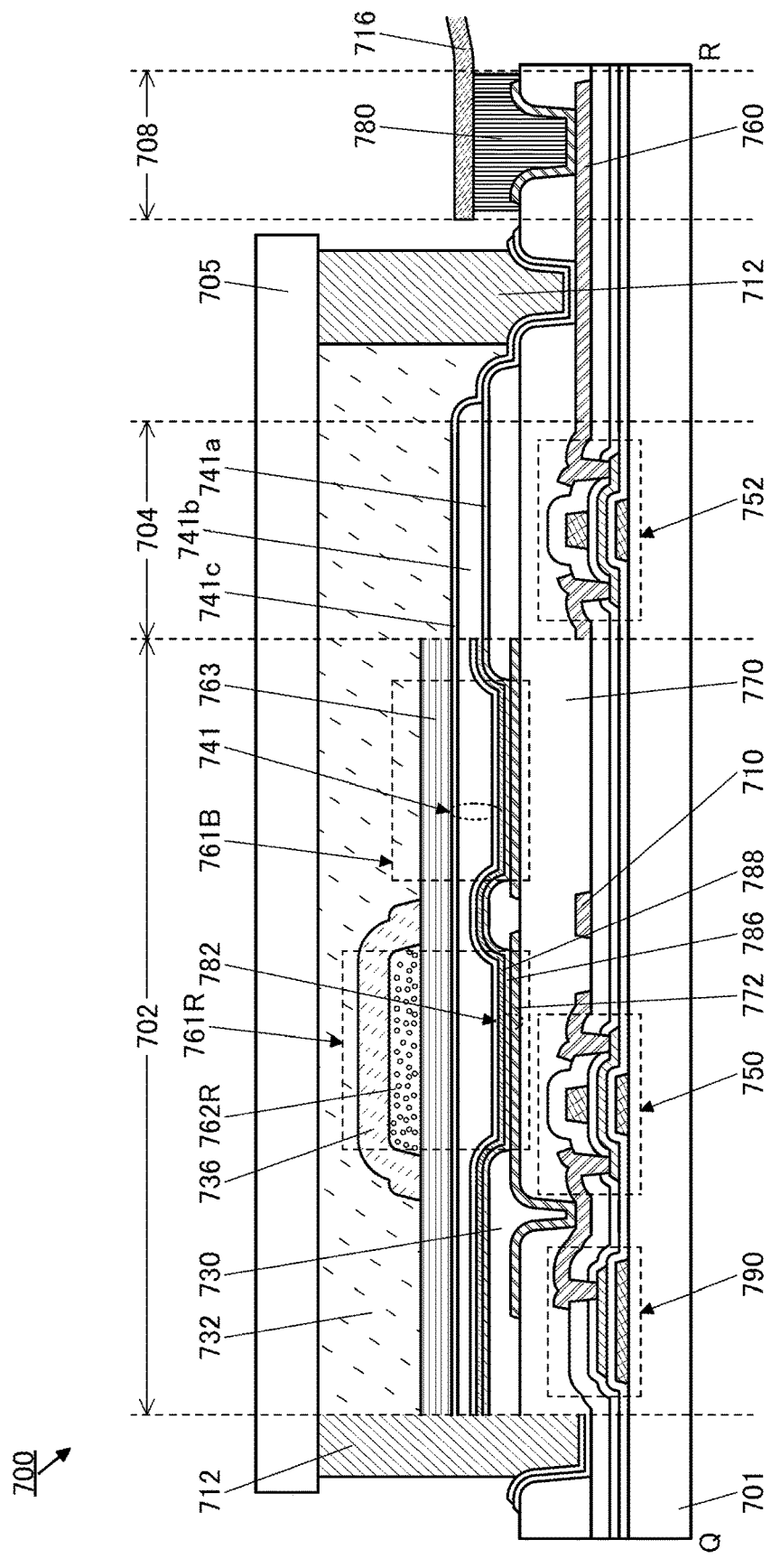
FIG. 10 is a diagram showing a structure example of a display device.
Figure 11:
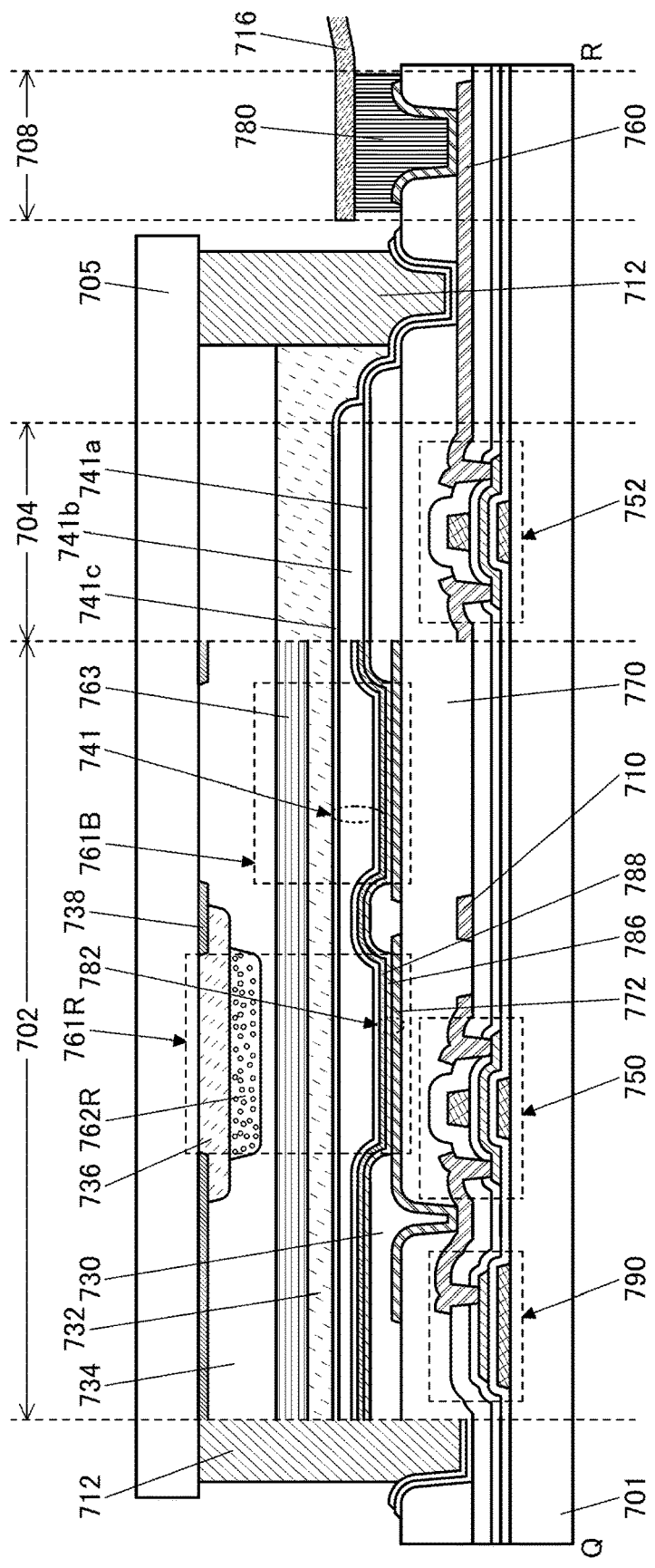
FIG. 11 is a diagram showing a structure example of a display device.
Figure 12:
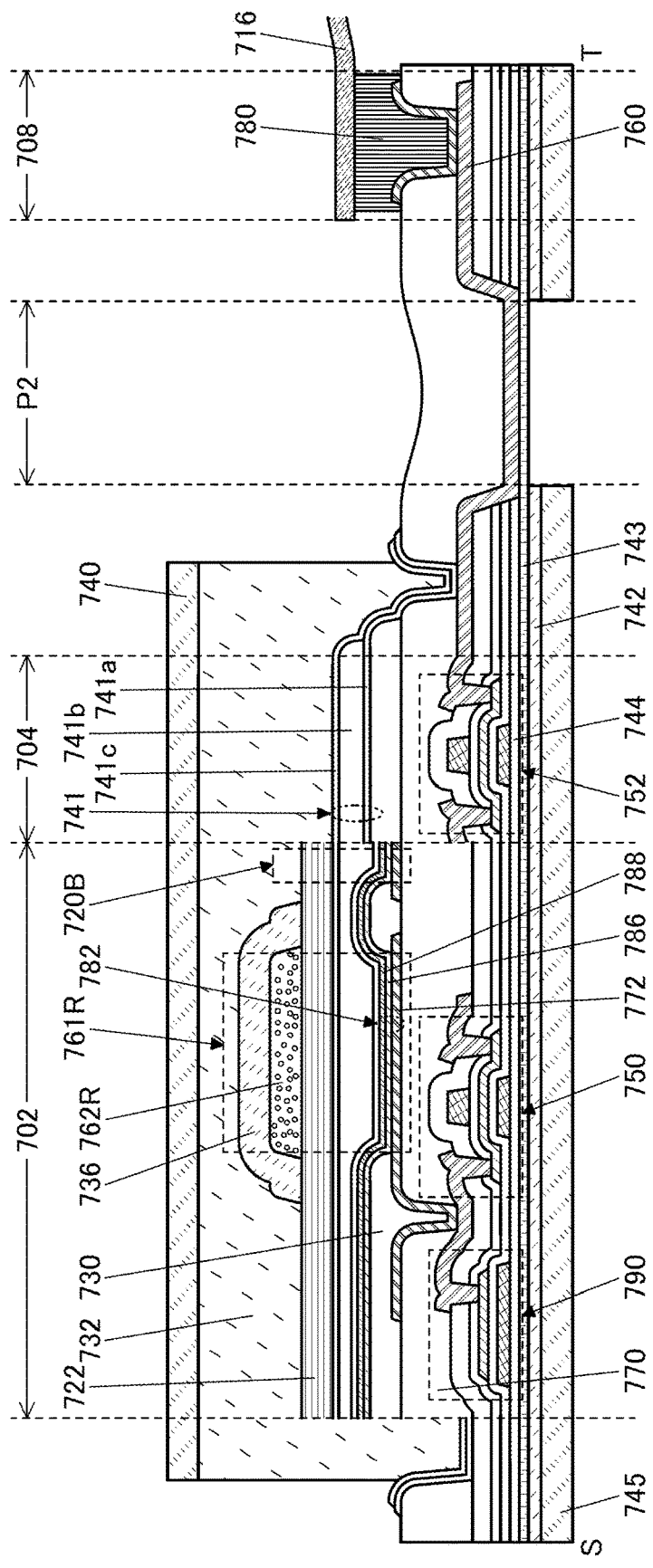
FIG. 12 is a diagram showing a structure example of a display device.

Structures including an EL element as a display element are described below with reference to FIG. 10 to FIG. 12. Note that FIG. 10 and FIG. 11 are cross-sectional views taken along a dashed-dotted line Q-R in the display device 700 in FIG. 9(A). FIG. 12 is a cross-sectional view taken along a dashed-dotted line S-T in the display device 700A in FIG. 9(B).

The common parts among display devices shown in FIG. 10 to FIG. 12 are described.

Display devices in FIG. 10 to FIG. 12 each include the pixel portion 702, the source driver circuit portion 704, and the FPC terminal portion 708. The pixel portion 702 includes a transistor 750 and a capacitor 790. The source driver circuit portion 704 includes a transistor 752.

The transistor 750 and the transistor 752 are each a transistor using an oxide semiconductor for a semiconductor layer in which a channel is formed. Not limited thereto, a transistor using silicon (amorphous silicon, polycrystalline silicon, or single-crystal silicon) for its semiconductor layer can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal and the like can be set longer. Accordingly, the frequency of refresh operations can be reduced, resulting in an effect of reducing power consumption.

The transistor used in this embodiment can have relatively high field-effect mobility and thus is capable of high-speed operation. For example, with the use of such a transistor capable of high-speed operation for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 shown in FIG. 10 to FIG. 12 includes a lower electrode formed by processing with the film which is the same as that for a first gate electrode of the transistor 750 and an upper electrode formed by processing the metal oxide film which is the same as that for the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are interposed between a pair of electrodes. A wiring obtained by processing the film which is the same as that for the source electrode and the drain electrode of the transistor 750 is connected to the upper electrode.

In addition, an insulating layer 770, which has a planarization function, is provided over the transistor 750, the transistor 752, and the capacitor 790.

As the transistor 750 included in the pixel portion 702 and the transistor 752 included in the source driver circuit portion 704, transistors having different structures may be used. For example, a structure may be employed in which a top-gate transistor is used as one of the transistors 750 and 752 and a bottom-gate transistor is used as the other of the transistors 750 and 752. Note that the gate driver circuit portion 706 is similar to the source driver circuit portion 704.

The pixel portion 702 is provided with the wiring 710. The wiring 710 functions as a source signal line, a gate signal line, a power supply line, or the like. Here, the wiring 710 is formed using the conductive film which is the same as that for the source electrode and the drain electrode of the transistor 750. Here, a low-resistance material such as a material containing a copper element is preferably used, in which case signal delay or the like due to the wiring resistance can be reduced and display on a large screen is possible.

The FPC terminal portion 708 includes a wiring 760, which partly serves as a connection electrode, an anisotropic conductive film 780, and the FPC 716. The wiring 760 is electrically connected to a terminal included in the FPC 716 through the anisotropic conductive film 780. Here, the wiring 760 is formed using the conductive film which is the same as that for the source electrodes and the drain electrodes of the transistor 750 and the like.

As the first substrate 701 and the second substrate 705, a glass substrate or a flexible substrate such as a plastic substrate can be used, for example. In the case where a flexible substrate is used as the first substrate 701, an insulating layer having a barrier property against water or hydrogen is preferably provided between the first substrate 701 and the transistor 750 and the like.

The display device in FIG. 10 includes a light-emitting unit 761R, a light-emitting unit 761B, a wavelength-conversion layer 762R, an optically functional layer 763, a coloring layer 736, a protective layer 741, and the like.

The light-emitting unit 761R includes a light-emitting element 782, the optically functional layer 763, the wavelength-conversion layer 762R, and the coloring layer 736. The light-emitting unit 761B includes the light-emitting element 782. The light-emitting element 782 is an element emitting blue light.

The light-emitting element 782 includes a conductive layer 772, an EL layer 786, and a conductive layer 788. The conductive layer 772 is electrically connected to the source electrode or the drain electrode included in the transistor 750. The conductive layer 772 is formed over the insulating layer 770, which functions as a planarization film, and functions as a pixel electrode. An insulating layer 730 is provided to cover an edge portion of the conductive layer 772; over the insulating layer 730 and the conductive layer 772, the EL layer 786 and a conductive layer 788 are stacked.

For the conductive layer 772, a material that reflects visible light (at least the light emitted by the EL layer 786) can be used. For example, a material including aluminum, silver, or the like can be used. For the conductive layer 788, a material that transmits visible light (at least the light emitted by the EL layer 786) can be used. For example, an oxide material including indium, zinc, tin, or the like is preferably used. Thus, the light-emitting element 782 is a top-emission light-emitting element, which emits light to the opposite side to the formation surface (second substrate 105 side).

The EL layer 786 contains an organic compound or an inorganic compound such as quantum dots. The EL layer 786 includes a light-emitting material emitting blue light when current flows.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material.

The optically functional layer 763 has a function of transmitting the blue light emitted by the light-emitting element 782 and reflecting red and green light.

When the blue light emitted by the light-emitting element 782 enters the wavelength-conversion layer 762R in the light-emitting unit 761R through the optically functional layer 763, the wavelength-conversion layer 762R has a function of converting the blue light to red light and emit the light. The coloring layer 736, which covers the wavelength-conversion layer 762R, has a function of transmitting red light and blocking light of the other colors. The light-emitting unit 761R emits red light.

The light-emitting unit 761B is not provided with a wavelength-conversion layer and a coloring layer; the light from the light-emitting element 782 emits to the outside through the optically functional layer 763. The light-emitting unit 761B emits blue light.

A light-emitting unit which emits green light is preferably included, which is not shown. In addition, the structure may include light-emitting units which emit light of yellow, white, cyan, magenta, and the like. The light-emitting element structure can be the same among light-emitting units with different colors in one embodiment of the present invention; when the materials of the wavelength-conversion layer 762R and the coloring layer 736 in the light-emitting unit 761R are changed, light-emitting units with different colors can be easily formed.

The coloring layer 736 covers the top surface and the side surfaces of the wavelength-conversion layer 762R; part of the coloring layer 736 extends over the end surface of the wavelength-conversion layer 762R and is in contact with the optically functional layer 763 as shown in FIG. 10. In other words, the wavelength-conversion layer 762R is surrounded by the coloring layer 736 and the optically functional layer 763. Such a structure can prevent accidental light emission when the light emitted by the light-emitting element 782 from the adjacent pixel reaches the wavelength-conversion layer 762R through an insulating film and the like. By preventing such accidental light emission, contrast and color reproducibility can be improved. The coloring layer 736 covers the top surface and the side surfaces of the light conversion layer 762R, whereby components of the wavelength-conversion layer 762R (e.g., quantum dots or fluorescent materials) are prevented from being diffused into the bonding layer 732 and the like.

The protective layer 741 is provided to cover the light-emitting element 782, and the optically functional layer 763 is provided over the protective layer 741. The protective layer 741 has a stacked-layer structure in which an insulating layer 741a, an insulating layer 741b, and an insulating layer 741c are stacked in this order. In that case, it is preferable that inorganic insulating films with a high barrier property against impurities such as water be used as the insulating layer 741a and the insulating layer 741c, and an organic insulating film which functions as a planarization film be used as the insulating layer 741b. The protective layer 741 also preferably extends also to the source driver circuit portion 704.

At the inner side than the sealant 712, an island-shaped organic insulating film is preferably formed to cover the transistor 750, the transistor 752, and the like. In other words, an end portion of the organic insulating film is preferably positioned inner than the sealant 712 or in a region overlapping with the sealant 712. FIG. 10 shows an example in which the insulating layer 770, an insulating layer 730, and the insulating layer 741b are processed to have island shapes. The insulating layer 741c and the insulating layer 741a are provided in contact with each other in a portion overlapping with the sealant 712, for example. The surfaces of the organic insulating films covering the transistor 750 and the transistor 752 are not exposed to the outside than the sealant 712; diffusion of water or hydrogen from the outside to the transistor 750 and the transistor 752 through the organic insulating film can be favorably prevented. This can prevent electrical-characteristic variation of the transistor, and an extremely reliable display device can be achieved.

FIG. 11 shows an example in which the coloring layer 736, the wavelength-conversion layer 762R, and the optically functional layer 763 are formed on the substrate 705 side.

On the substrate 701 side surface of the substrate 705 are provided the coloring layer 736, the wavelength-conversion layer 762R, an insulating layer 734 covering these layers, and the optically functional layer 763 covering the insulating layer 734. The bonding layer 732 between the optically functional layer 763 and the protective layer 741 bonds the substrate 701 and the substrate 705.

Between the light-emitting element 782 and the wavelength-conversion layer 762R, the insulating layer 734 and the bonding layer 732 are provided; compared to the structure in FIG. 10, the distance between the light-emitting element 782 and the wavelength-conversion layer 762R becomes large. Light from a light-emitting element of an adjacent pixel may enter the wavelength-conversion layer 762R to emit light, whereby contrast may be reduced. For this reason, the second substrate 705 is preferably provided with a blocking layer 738 positioned between adjacent pixels as shown in FIG. 11. The blocking layer 738 also has a function of preventing mixing of colors between adjacent pixels.

The protective layer 741 is not necessarily provided when the optically functional layer 763, the second substrate 705, the insulating layer 734, the bonding layer 732, or the like has a sufficient barrier property against impurities such as water.

FIG. 12 shows a structure of a display device which can be suitably used to a flexible display. FIG. 12 is a cross-sectional view of the display device 700A in FIG. 9(B).

The display device 700A in FIG. 12 has a structure in which a support substrate 745, an adhesive layer 742, the resin layer 743, and an insulating layer 744 are stacked instead of the substrate 701 in FIG. 10. The transistor 750, the capacitor 790, and the like are provided over the insulating layer 744 over the resin layer 743.

The support substrate 745 contains an organic resin, glass, or the like and is thin enough to have flexibility. The resin layer 743 contains an organic resin such as a polyimide or acrylic. The insulating layer 744 includes an inorganic insulating film of silicon oxide, silicon oxynitride, silicon nitride, or the like. The resin layer 743 and the support substrate 745 are bonded to each other with the adhesive layer 742. The resin layer 743 is preferably thinner than the support substrate 745.

The display device 700A in FIG. 12 includes a protective layer 740 instead of the substrate 705 in FIG. 10. The protective layer 740 is bonded to the bonding layer 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

FIG. 12 shows the region P2, which is bendable. The region P2 includes a portion where the support substrate 745, the adhesive layer 742, and the inorganic insulating film such as the insulating layer 744 are not provided. The region P2 has a structure in which the insulating layer 770 including an organic material covers the wiring 760 not to expose the wiring 760. When an inorganic insulating film is not provided as long as possible in the region P2, which can be bent, and only a conductive layer including a metal or an alloy and a layer including an organic material are stacked, generation of cracks at the time of bending can be prevented. When the support substrate 745 is not provided in the region P2, part of the display device 700A can be folded with an extremely small radius of curvature.

An input device may be provided in the display device 700 or the display device 700A shown in FIG. 10 to FIG. 12. An example of the input device includes a touch sensor.

Various types of sensors can be used such as a capacitive type, a resistive type, a surface acoustic wave type, an infrared type, an optical type, and a pressure-sensitive type. A combination of two or more of these types may be employed.

Examples of the touch panel structure include what is called an in-cell touch panel, in which an input device is provided between a pair of substrates, what is called an on-cell touch panel, in which an input device is formed over the substrate on the display side, or what is called an out-cell, touch panel in which an input device is attached to the display side.

[Components]

Components such as a transistor that can be used in the display device is described below.

[Transistor]

The transistors include a conductive layer functioning as the gate electrode, the semiconductor layer, a conductive layer functioning as the source electrode, a conductive layer functioning as the drain electrode, and an insulating layer functioning as the gate insulating layer.

Note that there is no particular limitation on the structure of the transistor included in the display device of one embodiment of the present invention. For example, a planar transistor may be employed, a staggered transistor may be employed, or an inverted staggered transistor may be employed. A top-gate or a bottom-gate transistor structure may be employed. Alternatively, gate electrodes may be provided above and below a channel.

There is no particular limitation on the crystallinity of a semiconductor material used for the transistors; any of an amorphous semiconductor, a single crystal semiconductor, and a semiconductor having crystallinity other than single crystal (a microcrystalline semiconductor, a polycrystalline semiconductor, a single-crystal semiconductor, or a semiconductor partly including crystal regions) may be used. It is preferable that a single crystal semiconductor or a semiconductor having crystallinity be used, in which case deterioration of the transistor characteristics can be suppressed.

In particular, a transistor that uses a metal oxide film for a semiconductor layer where a channel is formed is described below.

As a semiconductor material used for a transistor, a metal oxide whose energy gap is greater than or equal to 2 eV, preferably greater than or equal to 2.5 eV, further preferably greater than or equal to 3 eV can be used. A typical example is a metal oxide containing indium, and a CAC-OS described later or the like can be used, for example.

A transistor with a metal oxide having a larger band gap and a lower carrier density than silicon has low off-state current; therefore, charges accumulated in a capacitor that is series-connected to the transistor can be held for a long time.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where a metal oxide that constitutes the semiconductor layer is an In-M-Zn-based oxide, it is preferable that the atomic ratio of metal elements in a sputtering target used to deposit an In-M-Zn oxide satisfy In M and Zn M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the formed semiconductor layer may vary from the above atomic ratio between metal elements in the sputtering target in a range of ±40%.

A metal oxide film with a low carrier density is used for the semiconductor layer. For example, for the semiconductor layer, a metal oxide whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, even further preferably lower than $1 \times 10^{10}/cm^3$, and higher than or equal to $1 \times 10^{-9}/cm^3$ can be used. Such a metal oxide is referred to as a highly purified intrinsic or substantially highly purified intrinsic metal oxide. The metal oxide has a low impurity concentration and a low density of defect states and can be regarded as a metal oxide having stable characteristics.

Note that the composition is not limited to those, and an oxide semiconductor having an appropriate composition may be used depending on required semiconductor characteristics and electrical characteristics (field-effect mobility, threshold voltage, or the like) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of the Group 14 elements, is contained in the metal oxide that constitutes the semiconductor layer, oxygen vacancies in the semiconductor layer are increased, and the semiconductor layer becomes n-type. Thus, the concentration of silicon or carbon (measured by secondary ion mass spectrometry) in the semiconductor layer is set to $2 \times 10^{18}$ atoms/cm$^3$ or lower, preferably $2 \times 10^{17}$ atoms/cm$^3$ or lower.

Alkali metal and alkaline earth metal might generate carriers when bonded to a metal oxide, in which case the off-state current of the transistor might be increased. Thus, the concentration of alkali metal or alkaline earth metal in the semiconductor layer is set to lower than or equal to $1 \times 10^{18}$ atoms/cm$^3$, preferably lower than or equal to $2 \times 10^{16}$ atoms/cm$^3$.

Furthermore, when nitrogen is contained in the metal oxide that constitutes the semiconductor layer, electrons serving as carriers are generated and the carrier density is increased, so that the semiconductor layer easily becomes n-type. As a result, a transistor using a metal oxide that contains nitrogen is likely to have normally-on characteristics. Therefore, the concentration obtained by secondary ion mass spectrometry of nitrogen in the semiconductor layer is preferably set to lower than or equal to $5 \times 10^{18}$ atoms/cm$^3$.

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Note that the non-single-crystal oxide semiconductor can be suitably used for a semiconductor layer of a transistor disclosed in one embodiment of the present invention. As the non-single-crystal oxide semiconductor, the nc-OS or the CAAC-OS can be suitably used.

Note that the semiconductor layer may be a mixed film including two or more kinds of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a layered structure including two or more of the foregoing regions in some cases.

In addition, a CAC-OS (Cloud-Aligned Composite oxide semiconductor) is preferably used for a semiconductor layer of a transistor disclosed in one embodiment of the present invention. The use of the CAC-OS allows the transistor to have high electrical characteristics or high reliability.

<Composition of CAC-OS>

The composition of a CAC (Cloud-Aligned Composite)-OS that can be used in a transistor disclosed in one embodiment of the present invention is described below.

A CAC-OS refers to one composition of a material in which elements constituting a metal oxide are unevenly distributed within the range of 0.5 nm to 10 nm, preferably within the range of 1 nm and to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

Meanwhile, the CAC-OS relates to the material composition of a metal oxide. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Therefore, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions containing the selected metal element(s) as a main component(s) are observed in part of the CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas is more than or equal to 0% and less than 30%, preferably within the range of 0% to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (µ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when regions where $GaO_{X3}$ or the like is a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility ($\mu$) can be achieved.

A semiconductor element using a CAC-OS has high reliability. Thus, the CAC-OS is suitable for a variety of semiconductor devices typified by a display.

In addition, since a transistor including the CAC-OS in a semiconductor layer has high field-effect mobility and high drive capability, the use of the transistor in a driver circuit, a typical example of which is a scan line driver circuit that generates a gate signal, can provide a display device with a narrow bezel width (also referred to a narrow bezel). Furthermore, with the use of the transistor in a signal line driver circuit that is included in a display device (particularly in a demultiplexer connected to an output terminal of a shift register included in a signal line driver circuit), a display device to which a small number of wirings are connected can be provided.

Furthermore, the transistor including the CAC-OS in the semiconductor layer does not need a laser crystallization step like a transistor including low-temperature polysilicon. Thus, the manufacturing cost of a display device can be reduced even when the display device is formed using a large area substrate. In addition, the transistor including the CAC-OS in the semiconductor layer is preferably used for a driver circuit and a display portion in a large display device having high resolution such as ultra-high definition ("4K resolution," "4K2K," and "4K") or super high definition ("8K resolution," "8K4K," and "8K") because writing can be performed in a short time and display defects can be reduced.

Alternatively, silicon may be used for a semiconductor in which a channel of a transistor is formed. Although amorphous silicon may be used as silicon, silicon having crystallinity is particularly preferably used. For example, microcrystalline silicon, polycrystalline silicon, single-crystal silicon, or the like is preferably used. In particular, polycrystalline silicon can be formed at a temperature lower than that for single-crystal silicon and has higher field-effect mobility and higher reliability than amorphous silicon.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Furthermore, copper containing manganese is preferably used because it increases controllability of a shape by etching.

[Insulating Layer]

Examples of an insulating material that can be used for the insulating layers include, in addition to a resin such as acrylic or epoxy and a resin having a siloxane bond, an inorganic insulating material such as silicon oxide, silicon oxynitride, silicon nitride oxide, silicon nitride, or aluminum oxide.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1 \times 10^{-5}$ [g/(m²·day)], preferably lower than or equal to $1 \times 10^{-6}$ [g/(m²·day)], further preferably lower than or equal to $1 \times 10^{-7}$ [g/(m²·day)], still further preferably lower than or equal to $1 \times 10^{-8}$ [g/(m²·day)].

The above is the description of each of the components.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device of one embodiment of the present invention is described with reference to FIG. 13.

Figure 13A:
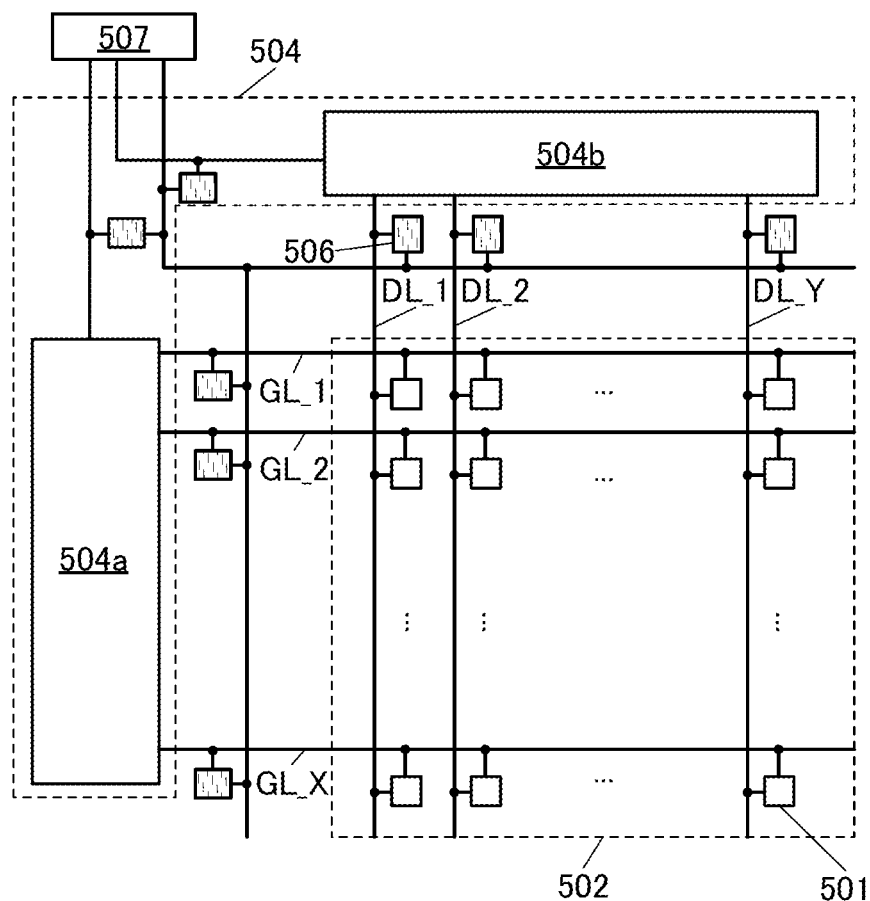
FIG. 13(A) is a block diagram of a display device.

A display device in FIG. 13(A) includes a pixel portion 502, a driver circuit portion 504, protection circuits 506, and a terminal portion 507. Note that a structure in which the protection circuits 506 are not provided may be employed.

The pixel portion 502 includes a plurality of pixel circuits 501, which drive a plurality of display elements that are arranged in X rows and Y columns (X and Y each independently represent a natural number of 2 or more).

The driver circuit portion 504 includes driver circuits such as a gate driver 504a, which outputs a scanning signal to scan lines GL_1 to GL_X, and a source driver 504b, which supplies a data signal to data lines DL_1 to DL_Y. The gate driver 504a includes at least a shift register. The source driver 504b is formed using a plurality of analog switches, for example. In addition, the source driver 504b may be formed using a shift register or the like.

The terminal portion 507 refers to a portion provided with terminals for inputting power, control signals, image signals, and the like to the display device from external circuits.

The protection circuit 506 is a circuit that makes, when a potential out of a certain range is applied to the wiring connected to the protection circuit, the wiring and another wiring be in conduction state. The protection circuit 506 in FIG. 13(A) is connected to a variety of wirings such as the scan lines GL that are wirings between the gate driver 504a and the pixel circuits 501 and the data lines DL that are wirings between the source driver 504b and the pixel circuits 501, for example. Note that the protection circuits 506 are hatched in FIG. 13(A) to distinguish the protection circuits 506 from the pixel circuits 501.

The gate driver 504a and the source driver 504b may be provided over the same substrate as the pixel portion 502, or a substrate where a gate driver circuit or a source driver circuit is separately formed (e.g., a driver circuit board formed using a single crystal semiconductor film or a polycrystalline semiconductor film) may be mounted on the substrate by COG or TAB (Tape Automated Bonding).

Figure 13B:
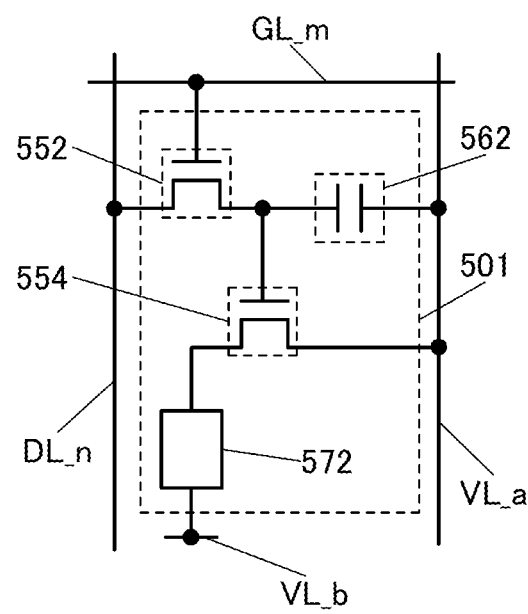
FIG. 13(B) is a circuit diagram.

The plurality of pixel circuits 501 in FIG. 13(A) can have a configuration in FIG. 13(B), for example.

The pixel circuit 501 shown in FIG. 13(B) includes a transistor 552, a transistor 554, a capacitor 562, and a light-emitting element 572. A data line DL_n, a scan line GL_m, a potential supply line VL_a, a potential supply line VL_b, and the like are connected to the pixel circuit 501.

Note that a high power supply potential VDD is supplied to one of the potential supply line VL_a and the potential supply line VL_b, and a low-power supply potential VSS is supplied to the other. Current flowing in the light-emitting element 572 is controlled in accordance with the potential applied to a gate of the transistor 554, whereby the luminance of light emitted from the light-emitting element 572 is controlled.

At least part of this embodiment can be implemented in combination with the other embodiments described in this specification as appropriate.

Embodiment 4

A pixel circuit including a memory for correcting gray levels displayed by pixels that can be used in one embodiment of the present invention and a display device including the pixel circuit are described below.

[Circuit Configuration]

Figure 14A:
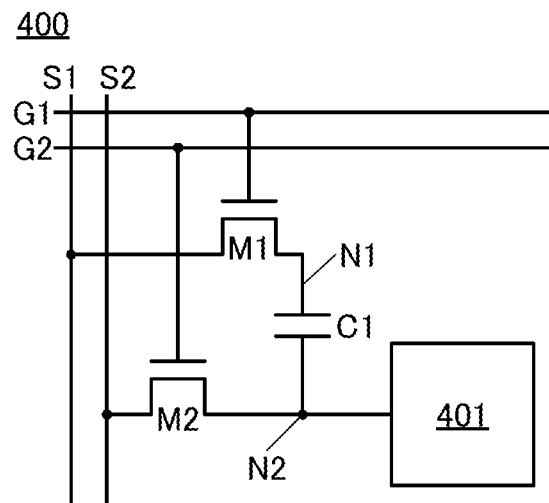
FIG. 14(A) and FIG. 14(C) are circuit diagrams of a display device.

FIG. 14(A) shows a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is N1, and a node connecting the transistor M2 and the circuit 401 is N2.

In the pixel circuit 400, the potential of the node N1 can be retained when the transistor M1 is turned off. The potential of the node N2 can be retained when the transistor M2 is turned off. When a predetermined potential is written in the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 14B:
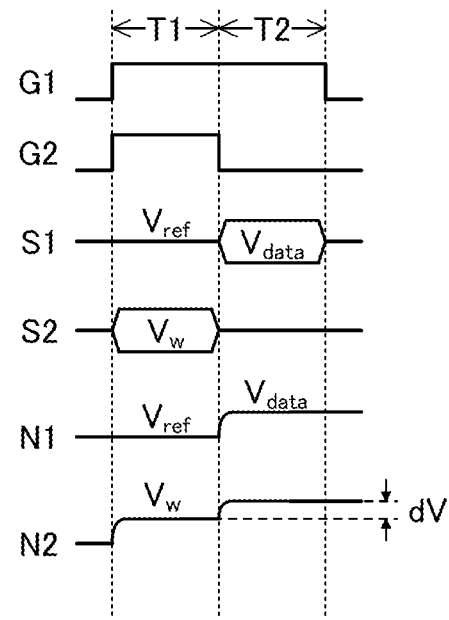
FIG. 14(B) is a timing chart.

Next, an example of a method for operating the pixel circuit 400 is described with reference to FIG. 14(B). FIG. 14(B) is a timing chart of an operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 14(B), one frame period is divided into a period T1 and a period T2. The period T1 is a period in which a potential is written in the node N2, and the period T2 is a period in which a potential is written in the node N1.

[Period T1]

In the period T1, a potential for turning on the transistor is supplied to both the wiring G1 and the wiring G2. In addition, a potential $V_{ref}$ that is a fixed potential is supplied to the wiring S1 and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w-V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 14(B), dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently higher than the capacitance of the circuit 401, the potential dV is a potential close to the second data potential $V_{data}$.

In the pixel circuit 400, a potential to be supplied to the circuit 401 including the display element can be generated by combination of two kinds of data signals as described above, whereby correction of a gradation level can be performed in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Example

Figure 14C:
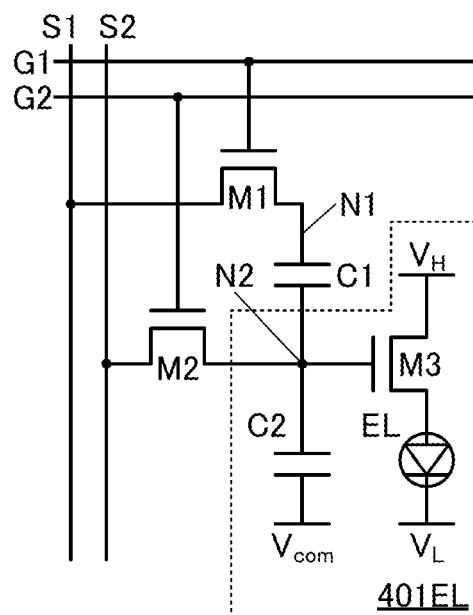

A pixel circuit 400EL in FIG. 14(C) includes a circuit 401EL. The circuit 401EL includes a light-emitting element EL, a transistor M3, and a capacitor C2.

In the transistor M3, a gate is connected to the node N2 and one electrode of the capacitor C2, one of a source and a drain is connected to a wiring supplied with a potential VH, and the other of the source and the drain is connected to one electrode of the light-emitting element EL. The other electrode of the capacitor C2 is connected to a wiring supplied with a potential $V_{co}m$. The other electrode of the light-emitting element EL is connected to a wiring supplied with a potential VL.

The transistor M3 has a function of controlling current to be supplied to the light-emitting element EL. The capacitor C2 serves as a storage capacitor. The capacitor C2 can be omitted when not needed.

Note that although the structure is described here in which the anode side of the light-emitting element EL is connected to the transistor M3, the transistor M3 may be connected to the cathode side. In that case, the values of the potential VH and the potential VL can be appropriately changed.

In the pixel circuit 400EL, a large amount of current can flow in the light-emitting element EL when a high potential is applied to the gate of the transistor M3, which enables HDR display or the like. Moreover, variation in the electrical characteristics of the transistor M3 and the light-emitting element EL can be corrected by supply of a correction signal to the wiring S1 or the wiring S2.

Note that the configuration is not limited to the circuits shown in FIG. 14(C), and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention is described.

Figure 15A:
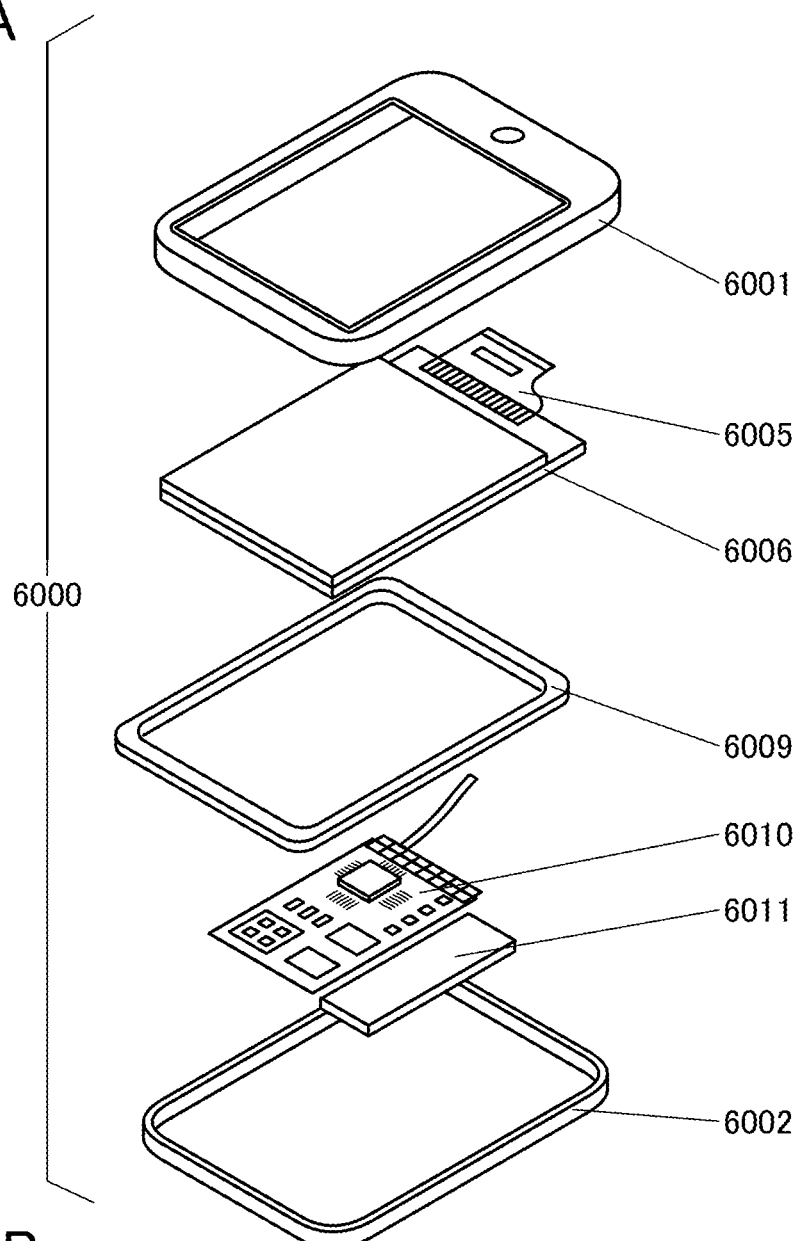
FIG. 15(A) and FIG. 15(B) are diagrams showing a structure example of a display module.

In a display module 6000 in FIG. 15(A), a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low-power consumption can be achieved.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

Figure 15B:
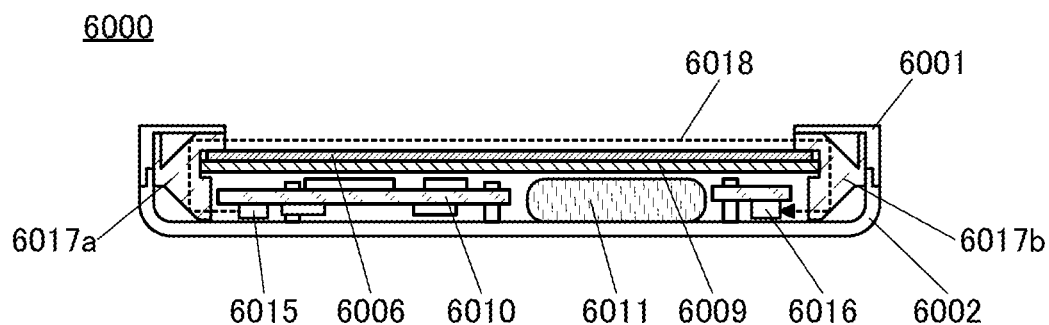

FIG. 15(B) is a schematic cross-sectional view of the display module 6000 having an optical touch sensor.

The display module 6000 includes a light-emitting portion 6015 and a light-receiving portion 6016, which are provided on the printed circuit board 6010. Furthermore, a pair of light guide portions (a light guide portion 6017a and a light guide portion 6017b) are provided in a region surrounded by the upper cover 6001 and the lower cover 6002.

The display device 6006 overlaps the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of the light-emitting portions 6015 are provided along two adjacent sides of the display device 6006, for example. A plurality of the light-receiving portions 6016 are provided so as to face the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be favorably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin which absorbs visible light and transmits infrared rays is used, a malfunction of the touch sensor can be more effectively inhibited.

At least part of this embodiment can be implemented in combination with the other embodiments described in this specification as appropriate.

Embodiment 6

In this embodiment, an example of an electronic device for which the display device of one embodiment of the present invention can be used is described.

Figure 16A:
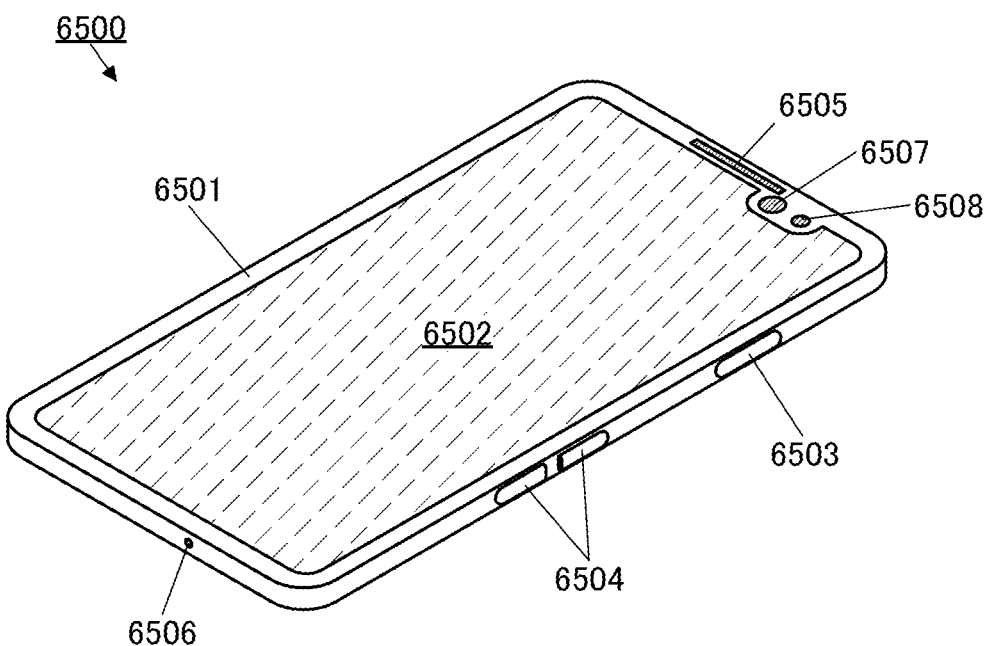
FIG. 16(A) and FIG. 16(B) are diagrams showing a structure example of an electronic device.

An electronic device 6500 in FIG. 16(A) is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 16B:
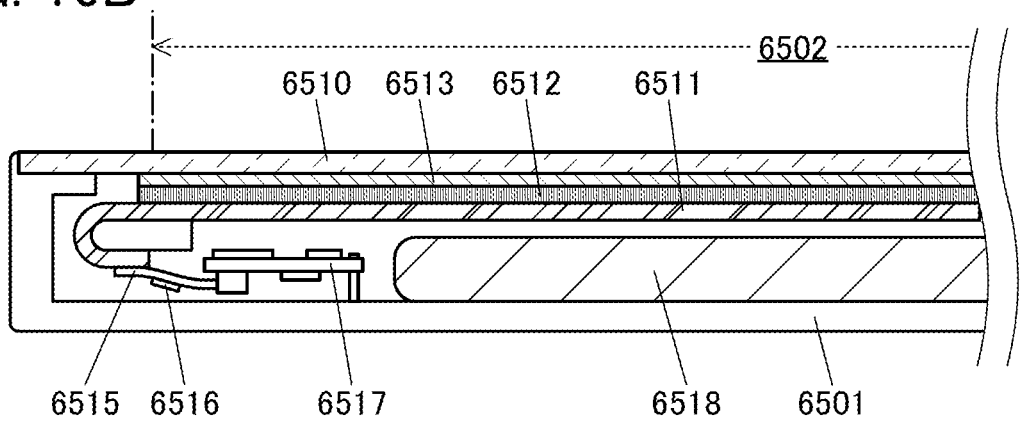

FIG. 16(B) is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not shown.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be provided. Furthermore, since the display panel 6511 is extremely thin, the battery 6518 with a high capacity can be provided without an increase in the thickness of the electronic device. An electronic device with a narrow frame can be obtained when part of the display panel 6511 is folded back so that the portion connected to the FPC 6515 is positioned on the rear side of a pixel portion.

At least part of this embodiment can be implemented in combination with the other embodiments described in this specification as appropriate.

Embodiment 7

In this embodiment, electronic devices each including a display device manufactured using one embodiment of the present invention are described.

Electronic devices exemplified below include a display device of one embodiment of the present invention in a display portion. Thus, the electronic device achieves high resolution. In addition, the electronic devices can achieve both high resolution and a large screen.

The display portion of the electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, or a game machine.

The electronic device using one embodiment of the present invention can be incorporated along a flat surface or a curved surface of an inside wall or an outside wall of a house or a building, an interior or an exterior of a car, or the like.

Figure 17A:
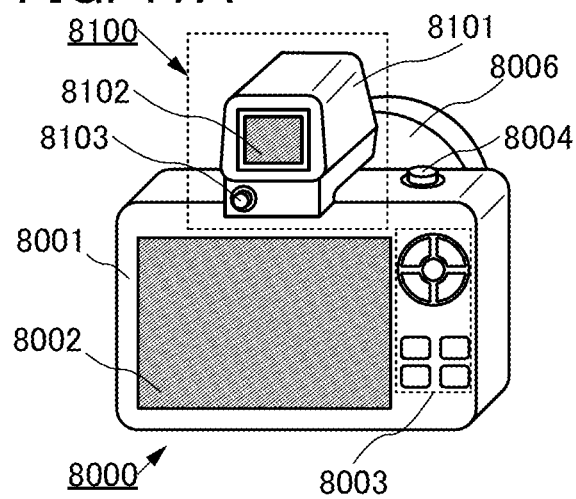
FIG. 17(A) to FIG. 17(E) are diagrams showing structure examples of electronic devices.

FIG. 17(A) is an external view of a camera 8000 to which a finder 8100 is attached.

The camera 8000 includes a housing 8001, a display portion 8002, operation buttons 8003, a shutter button 8004, and the like. A detachable lens 8006 is attached to the camera 8000.

Note that the lens 8006 and the housing may be integrated with each other in the camera 8000.

The camera 8000 can take images by pressing the shutter button 8004 or touching the display portion 8002, which serves as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video received from the camera 8000 and the like on the display portion 8102.

The button 8103 serves as a power button or the like.

The display device of one embodiment of the present invention can be used for the display portion 8002 of the camera 8000 and the display portion 8102 of the finder 8100. Note that a finder may be incorporated in the camera 8000.

Figure 17B:
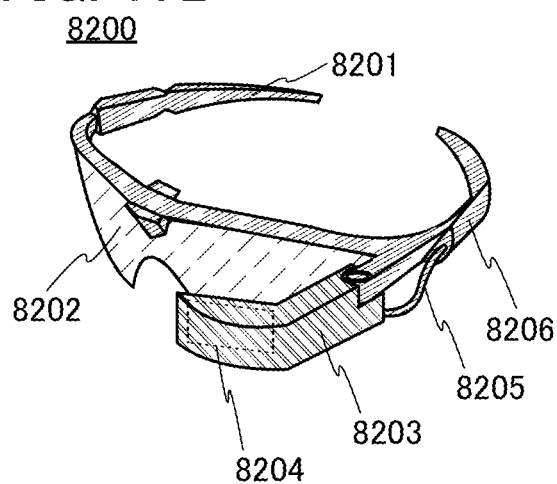

FIG. 17(B) is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user to achieve a function of recognizing the user's sight line. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display device of one embodiment of the present invention can be used for the display portion 8204.

Figure 17C:
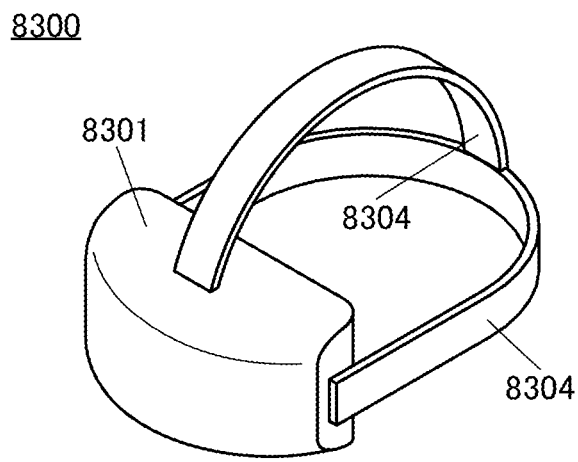
Figure 17D:
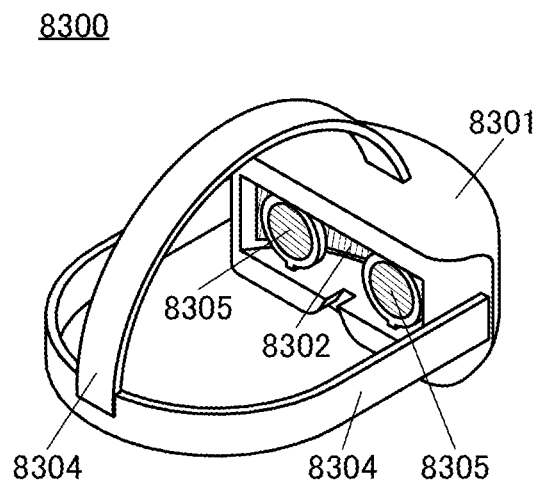
Figure 17E:
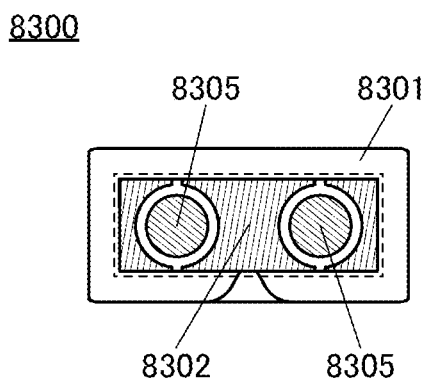

FIG. 17(C), FIG. 17(D), and FIG. 17(E) are diagrams showing appearance of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified using the lenses 8305 as in FIG. 17(E), the user does not perceive pixels, and a more realistic video can be displayed.

Electronic devices in FIG. 18(A) to FIG. 18(G) include a housing 9000, a display portion 9001, a speaker 9003, an operation key 9005 (including a power switch or an operation switch), a connection terminal 9006, a sensor 9007 (having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIG. 18(A) to FIG. 18(G) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 18(A) to FIG. 18(G) are described below.

Figure 18A:
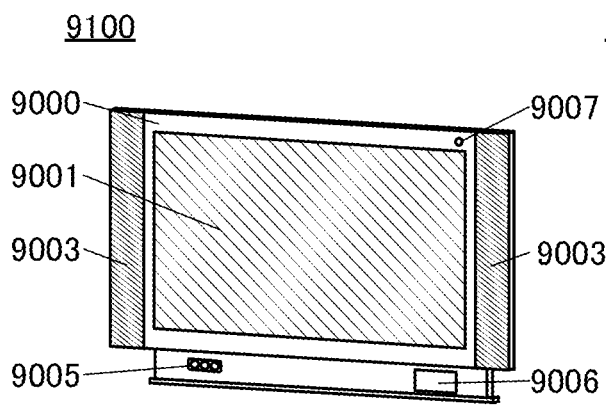
FIG. 18(A) to FIG. 18(G) are diagrams showing structure examples of electronic devices.

FIG. 18(A) is a perspective view showing a television device 9100. The television device 9100 can include the display portion 9001 having a large screen size of, for example, 50 inches or more, or 100 inches or more.

Figure 18D:
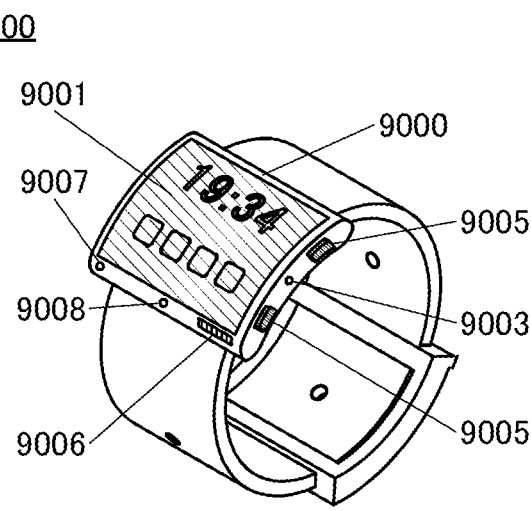
Figure 18B:
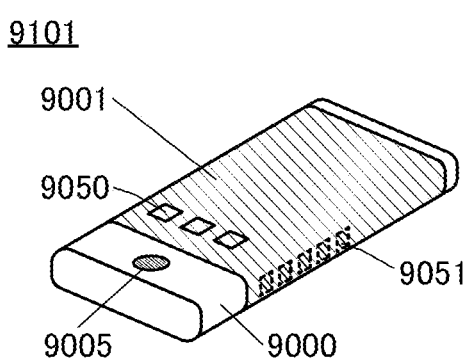

FIG. 18(B) is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 18(B) shows an example in which three icons 9050 are displayed. Information 9051 indicated by dashed rectangles can be displayed on another surface of the display portion 9001. Examples of the information 9051 include notification of reception of an e-mail, a message of SNS, or an incoming call, the title and sender of an e-mail, a message of SNS, or the like, the date, the time, remaining battery, and the reception strength of an antenna. Alternatively, the icon 9050 or the like may be displayed in the position where the information 9051 is displayed.

Figure 18E:
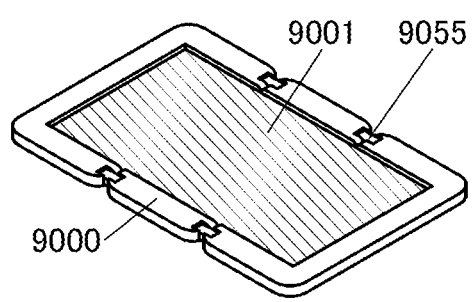
Figure 18C:
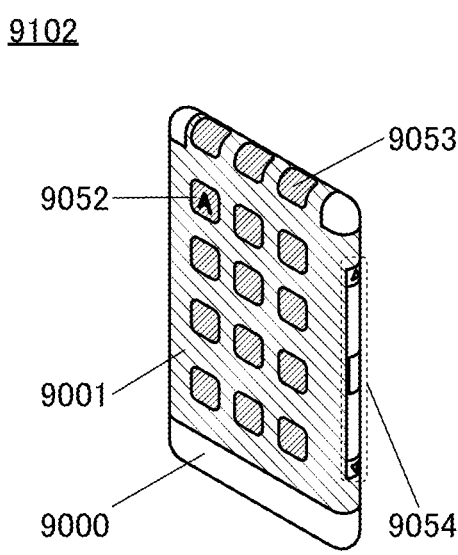

FIG. 18(C) is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 18(D) is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 18F:
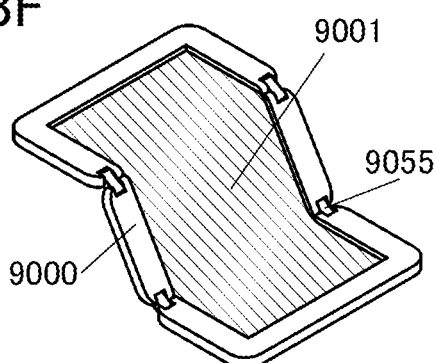
Figure 18G:
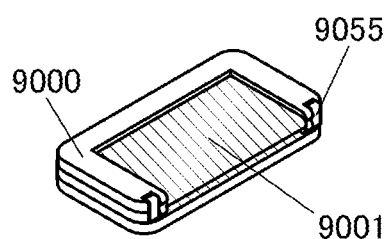

FIGS. 18(E), 18(F), and 18(G) are perspective views showing a foldable portable information terminal 9201. FIG. 18(E) is a perspective view of an opened state of the portable information terminal 9201, FIG. 18(G) is a perspective view of a folded state thereof, and FIG. 18(F) is a perspective view of a state in the middle of change from one of FIG. 18(E) and FIG. 18(G) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 1 mm and less than or equal to 150 mm.

Figure 19A:
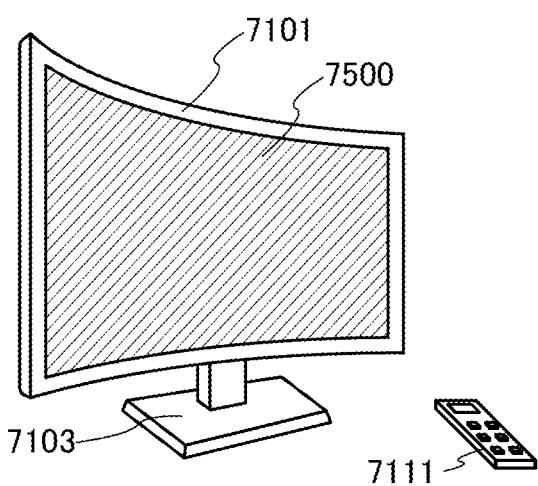
FIG. 19(A) to FIG. 19(D) are diagrams showing structure examples of electronic devices.

FIG. 19(A) shows an example of a television device. In a television device 7100, a display portion 7500 is incorporated in a housing 7101. Here, a structure in which the housing 7101 is supported by a stand 7103 is shown.

Operation of the television device 7100 shown in FIG. 19(A) can be performed with an operation switch provided in the housing 7101 or a separate remote controller 7111. Alternatively, a touch panel may be used for the display portion 7500, and the television device 7100 may be operated by touch on the touch panel. The remote controller 7111 may be provided with a display portion in addition to operation buttons.

Note that the television device 7100 may include a television receiver and a communication device for a network connection.

Figure 19B:
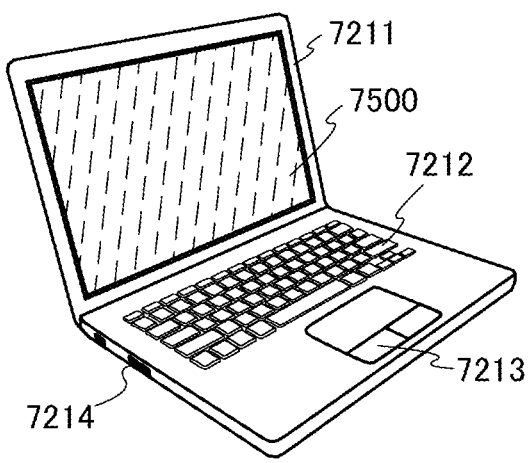

FIG. 19(B) shows a laptop personal computer 7200. A laptop personal computer 7200 includes a housing 7211, a keyboard 7212, a pointing device 7213, an external connection port 7214, and the like. In the housing 7211, the display portion 7500 is incorporated.

Figure 19C:
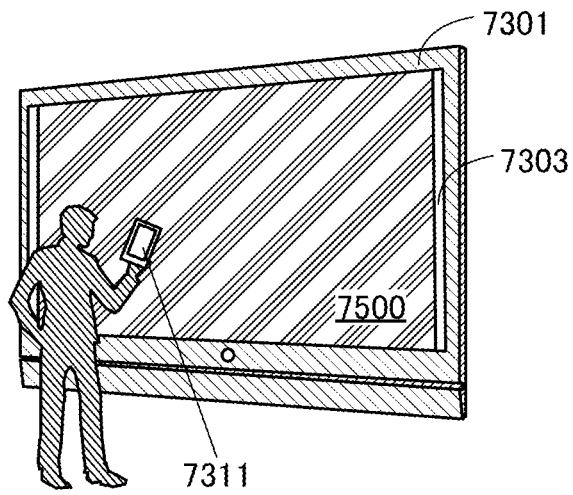
Figure 19D:
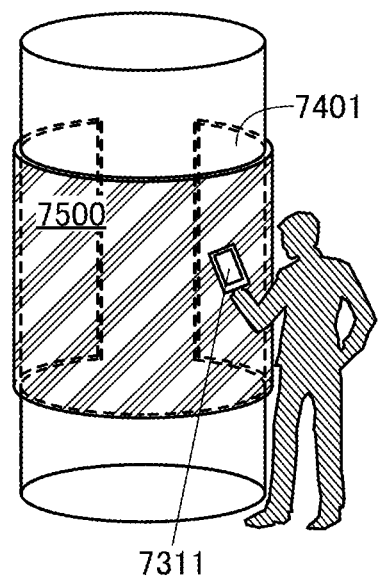

FIG. 19(C) and FIG. 19(D) show examples of digital signage.

Digital signage 7300 shown in FIG. 19(C) includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

In addition, FIG. 19(D) is digital signage 7400 attached to a cylindrical pillar 7401. The digital signage 7400 includes the display portion 7500 provided along a curved surface of the pillar 7401.

The larger display portion 7500 can increase the amount of data that can be provided at a time and attracts more attention, so that the effectiveness of the advertisement can be increased, for example.

A touch panel is preferably used in the display portion 7500 so that the user can operate the digital signage. Thus, the digital signage can be used for not only advertising but also providing information that the user needs, such as route information, traffic information, and an information map of a commercial facility.

As shown in FIG. 19(C) and FIG. 19(D), it is preferable that the digital signage 7300 or the digital signage 7400 be capable of working with an information terminal 7311 such as user's smartphone through wireless communication. For example, information of an advertisement displayed on the display portion 7500 can be displayed on a screen of the information terminal 7311. By operation of the information terminal 7311, display on the display portion 7500 can be switched.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used in the display portion 7500 in FIGS. 19(A) to 19(D).

At least part of this embodiment can be implemented in combination with the other embodiments described in this specification as appropriate.

REFERENCE NUMERALS

0: display device, 11B, 11G, 11R: pixel, 12B: light-emitting element, 13: optically functional layer, 14, 14G, 14R: wavelength-conversion layer, 51, 52: electrode, 53B: EL layer, 59: charge-generation layer, 60B: light-emitting unit, 61: hole-injection layer, 62: hole-transport layer, 63: light-emitting layer, 64: electron-transport layer, 65: electron-injection layer, 100, 100A-100G: display device, 101, 102, 103, 105: substrate, 110B: light-emitting element, 111, 113: conductive layer, 112: EL layer, 115: insulating layer, 120B, 120G, 120R: pixel, 121: optically functional layer, 122B, 122G, 122R: wavelength-conversion layer, 123G, 123R: coloring layer, 124: diffusion layer, 131, 132: bonding layer, 135, 136: insulating layer, 137: bonding layer, 140: protective layer, 141, 142, 143: insulating layer, 150, 150A: display device, 160B, 160U: light-emitting element, 161: conductive layer, 162, 162U: semiconductor layer, 163: conductive layer, 164: substrate, 165: terminal, 166: bump, 168: terminal This application is based on Japanese Patent Application Serial No. 2018-136888 filed with Japan Patent Office on Jul. 20, 2018, the entire contents of which are hereby incorporated herein by reference.

The invention claimed is:

1. A display device comprising:
a first transistor;
a first light-emitting element comprising:
a first electrode being a reflective electrode;
a light-emitting layer over the first electrode; and
a second electrode being a transmissive and reflective electrode;
a protective layer covering the first light-emitting element;
an optically functional layer over and in contact with the protective layer; and
a wavelength-conversion layer over the optically functional layer,
wherein one of the first electrode and the second electrode is electrically connected to one of a source electrode and a drain electrode of the first transistor,
wherein the protective layer has a flat top surface,
wherein the wavelength-conversion layer and the first light-emitting element overlap each other,
wherein the first light-emitting element is configured to emit a first light,
wherein the wavelength-conversion layer is capable of emitting a second light by entering the first light,
wherein the second light has a longer wavelength than the first light, and
wherein the optically functional layer is capable of transmitting the first light and reflecting the second light.

2. The display device according to claim 1, wherein the wavelength-conversion layer comprises quantum dots.

3. The display device according to claim 1, wherein the optically functional layer is a dielectric multilayer film that two kinds of dielectric films with different refractive indices are alternately stacked.

4. The display device according to claim 1,
wherein the wavelength-conversion layer is positioned over and in contact with the optically functional layer.

5. The display device according to claim 4, further comprising a coloring layer over the wavelength-conversion layer,
wherein the coloring layer is capable of transmitting the second light and blocking the first light, and
wherein the coloring layer is on and in contact with a top surface and a side surface of the wavelength-conversion layer and on and in contact with a top surface of the optically functional layer.

6. The display device according to claim 1,
wherein the protective layer comprises a first insulating film comprising an inorganic insulating material and a second insulating film comprising an organic insulating material over the first insulating film, and
wherein the second insulating film functions as a planarization layer.

7. The display device according to claim 1, further comprising a first substrate over the first light-emitting element,
wherein the wavelength-conversion layer, a planarization layer, and the optically functional layer are stacked in this order over a surface of the first substrate on the first light-emitting element side.

8. The display device according to claim 7, further comprising a coloring layer between the first substrate and the wavelength-conversion layer,
wherein the coloring layer is capable of transmitting the second light and blocking the first light.

9. The display device according to claim 1, further comprising a first substrate being in contact with the wavelength-conversion layer.

10. A display device comprising:
a first pixel comprising a first light-emitting element and a first transistor;
a second pixel comprising a second light-emitting element and a second transistor;
a protective layer covering the first light-emitting element and the second light-emitting element; and
an optically functional layer,
wherein the first light-emitting element comprises:
a first reflective electrode;
a first light-emitting layer over the first reflective electrode;

a first transmissive and reflective electrode; and
a wavelength-conversion layer over the optically functional layer,
wherein the second light-emitting element comprises:
a second reflective electrode;
a second light-emitting layer over the first reflective electrode;
a second transmissive and reflective electrode; and
wherein the optically functional layer is over and in contact with the protective layer,
wherein the protective layer has a flat top surface,
wherein the optically functional layer and each of the first light-emitting element and the second light-emitting element overlap each other,
wherein each of the first light-emitting element and the second light-emitting element is configured to emit a first light,
wherein the wavelength-conversion layer and the first light-emitting element overlap each other so that the first light emitted from the first light-emitting element is converted into a second light by the wavelength-conversion layer,
wherein the first pixel is configured to emit the second light,
wherein the second pixel is configured to emit the first light,
wherein the second light has a longer wavelength than the first light, and
wherein the optically functional layer is capable of transmitting the first light and reflecting the second light.

11. The display device according to claim 10, wherein the wavelength-conversion layer comprises quantum dots.

12. The display device according to claim 10, wherein the optically functional layer is a dielectric multilayer film that two kinds of dielectric films with different refractive indices are alternately stacked.

13. The display device according to claim 10,
wherein the wavelength-conversion layer is positioned over and in contact with the optically functional layer.

14. The display device according to claim 13, further comprising a coloring layer over the wavelength-conversion layer,
wherein the coloring layer is capable of transmitting the second light and blocking the first light, and
wherein the coloring layer is on and in contact with a top surface and a side surface of the wavelength-conversion layer and on and in contact with a top surface of the optically functional layer.

15. The display device according to claim 10,
wherein the protective layer comprises a first insulating film comprising an inorganic insulating material and a second insulating film comprising an organic insulating material over the first insulating film, and
wherein the second insulating film functions as a planarization layer.

16. The display device according to claim 10, further comprising a first substrate over the first light-emitting element,
wherein the wavelength-conversion layer, a planarization layer, and the optically functional layer are stacked in this order over a surface of the first substrate on the first light-emitting element side.

17. The display device according to claim 16, further comprising a coloring layer between the first substrate and the wavelength-conversion layer,
wherein the coloring layer is capable of transmitting the second light and blocking the first light.

18. The display device according to claim 10, further comprising a first substrate being in contact with the wavelength-conversion layer.

* * * * *